United States Patent
Nelson et al.

(10) Patent No.: US 9,432,611 B1
(45) Date of Patent: Aug. 30, 2016

(54) VOICE RADIO TUNING

(71) Applicant: Rockwell Collins, Inc., Cedar Rapids, IA (US)

(72) Inventors: Brent J. Nelson, Marion, IA (US); David A. Gribble, Rio Rancho, NM (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 17 days.

(21) Appl. No.: 14/631,646

(22) Filed: Feb. 25, 2015

(51) Int. Cl.
| | |
|---|---|
| H04B 1/18 | (2006.01) |
| H04N 5/50 | (2006.01) |
| H04L 29/08 | (2006.01) |
| G08G 5/00 | (2006.01) |
| G10L 15/26 | (2006.01) |
| G02B 27/00 | (2006.01) |

(52) U.S. Cl.
CPC ............ *H04N 5/50* (2013.01); *G02B 27/0093* (2013.01); *G08G 5/003* (2013.01); *G10L 15/265* (2013.01); *H04L 67/12* (2013.01)

(58) Field of Classification Search
CPC .............. G10L 15/26; B60R 16/0373; G01C 21/3608; H04M 2250/74
USPC ......... 701/3, 9, 11, 36; 704/270, 270.1, 275; 455/140, 150.1, 151.1, 154.1, 179.1, 455/563
See application file for complete search history.

(56) References Cited

U.S. PATENT DOCUMENTS

| | | | |
|---|---|---|---|
| 4,725,959 A | 2/1988 | Nagata | |
| 5,751,260 A | 5/1998 | Nappi et al. | |
| 5,818,423 A | 10/1998 | Pugliese et al. | |
| 5,926,790 A | 7/1999 | Wright | |
| 5,956,681 A | 9/1999 | Yamakita | |
| 5,960,399 A | 9/1999 | Barclay et al. | |
| 5,974,384 A | 10/1999 | Yasuda | |
| 6,173,192 B1 | 1/2001 | Clark | |
| 7,089,108 B2 * | 8/2006 | Merritt | G08G 5/0034 244/158.1 |
| 7,200,555 B1 | 4/2007 | Ballard et al. | |
| 7,415,326 B2 * | 8/2008 | Komer | G10L 15/26 701/3 |
| 7,606,715 B1 | 10/2009 | Krenz | |
| 7,809,405 B1 | 10/2010 | Rand et al. | |
| 7,856,248 B1 | 12/2010 | Fujisaki | |

(Continued)

FOREIGN PATENT DOCUMENTS

WO  2014057140 A3  4/2014

OTHER PUBLICATIONS

Matt Thurber, Garmin G5000 Adds Vision to Learjet Cockpit, Aviation International News, Oct. 3, 2012, Printed online at: http://www.ainonline.com/aviation-news/aviation-international-news/2012-10-03/garmin-g5000-adds-vision-learjet-cockpit, 4 pages.

(Continued)

*Primary Examiner* — Sonny Trinh
(74) *Attorney, Agent, or Firm* — Angel N. Gerdzhikov; Donna P. Suchy; Daniel M. Barbieri

(57) ABSTRACT

A method includes receiving text data corresponding to user speech recognized by a voice recognition system. The method also includes determining a desired radio and a desired radio frequency based at least on the text data. Additionally, the method includes performing one or more radio tuning operations to tune the desired radio to the desired radio frequency.

20 Claims, 15 Drawing Sheets

(56) References Cited

U.S. PATENT DOCUMENTS

| | | | |
|---|---|---|---|
| 7,881,493 B1 | 2/2011 | Edwards et al. | |
| 7,881,832 B2 * | 2/2011 | Komer | G10L 15/26 244/222 |
| 7,912,592 B2 | 3/2011 | Komer et al. | |
| 8,139,025 B1 | 3/2012 | Krenz | |
| 8,234,121 B1 | 7/2012 | Swearingen | |
| 8,311,827 B2 | 11/2012 | Hernandez et al. | |
| 8,515,763 B2 * | 8/2013 | Dong | G10L 15/22 701/14 |
| 8,543,157 B1 | 9/2013 | Fujisaki | |
| 8,666,748 B2 * | 3/2014 | Dong | G08G 5/0013 704/270 |
| 8,793,139 B1 | 7/2014 | Serban et al. | |
| 9,190,073 B2 * | 11/2015 | Dong | G10L 21/06 |
| 2002/0143533 A1 | 10/2002 | Lucas et al. | |
| 2002/0198721 A1 | 12/2002 | Weiser | |
| 2003/0110028 A1 | 6/2003 | Bush | |
| 2003/0210280 A1 | 11/2003 | Baker et al. | |
| 2003/0216861 A1 | 11/2003 | Sakata | |
| 2004/0162727 A1 | 8/2004 | Kiuchi et al. | |
| 2005/0065779 A1 | 3/2005 | Odinak | |
| 2005/0143134 A1 | 6/2005 | Harwood et al. | |
| 2005/0203676 A1 | 9/2005 | Sandell et al. | |
| 2005/0203700 A1 | 9/2005 | Merritt | |
| 2005/0203729 A1 | 9/2005 | Roth et al. | |
| 2006/0080079 A1 | 4/2006 | Yamabana | |
| 2006/0111890 A1 | 5/2006 | Mowatt et al. | |
| 2006/0218492 A1 | 9/2006 | Andrade | |
| 2006/0256083 A1 | 11/2006 | Rosenberg | |
| 2007/0043563 A1 | 2/2007 | Comerford et al. | |
| 2007/0050133 A1 | 3/2007 | Yoshikawa et al. | |
| 2007/0073472 A1 | 3/2007 | Odinak et al. | |
| 2007/0124694 A1 | 5/2007 | Van De Sluis et al. | |
| 2007/0189328 A1 | 8/2007 | Judd | |
| 2007/0219805 A1 | 9/2007 | Nomura | |
| 2007/0288242 A1 | 12/2007 | Spengler et al. | |
| 2008/0065275 A1 | 3/2008 | Vizzini | |
| 2008/0114541 A1 | 5/2008 | Shintani et al. | |
| 2008/0120106 A1 | 5/2008 | Izumida et al. | |
| 2008/0120665 A1 | 5/2008 | Relyea et al. | |
| 2008/0147410 A1 | 6/2008 | Odinak | |
| 2008/0195309 A1 | 8/2008 | Prinzel, III et al. | |
| 2008/0221886 A1 | 9/2008 | Colin et al. | |
| 2009/0302174 A1 | 12/2009 | Ausman et al. | |
| 2010/0030400 A1 | 2/2010 | Komer et al. | |
| 2011/0125503 A1 | 5/2011 | Dong et al. | |
| 2011/0148772 A1 | 6/2011 | Oksman et al. | |
| 2011/0160964 A1 | 6/2011 | Obradovich | |
| 2011/0288871 A1 | 11/2011 | Suzuki | |
| 2011/0301943 A1 | 12/2011 | Patch | |
| 2013/0010934 A1 | 1/2013 | Miller | |
| 2013/0204469 A1 | 8/2013 | Horsager et al. | |
| 2013/0307771 A1 | 11/2013 | Parker et al. | |
| 2013/0332160 A1 | 12/2013 | Posa | |
| 2014/0088970 A1 | 3/2014 | Kang | |
| 2014/0180698 A1 | 6/2014 | Kai | |
| 2014/0237367 A1 | 8/2014 | Jung et al. | |
| 2014/0304280 A1 | 10/2014 | Oursbourn et al. | |
| 2014/0372117 A1 | 12/2014 | Nakata et al. | |
| 2015/0007116 A1 | 1/2015 | Visser | |
| 2015/0019227 A1 | 1/2015 | Anandarajah | |
| 2015/0130711 A1 | 5/2015 | Lee et al. | |
| 2015/0142428 A1 | 5/2015 | Zhao et al. | |
| 2015/0156803 A1 | 6/2015 | Ballard et al. | |
| 2015/0162001 A1 | 6/2015 | Kar et al. | |
| 2015/0213634 A1 | 7/2015 | Karmarkar et al. | |
| 2015/0217870 A1 | 8/2015 | McCullough et al. | |
| 2015/0261496 A1 | 9/2015 | Faaborg et al. | |
| 2015/0364044 A1 | 12/2015 | Kashi et al. | |
| 2015/0375853 A1 | 12/2015 | Kawalkar | |

OTHER PUBLICATIONS

B.K. Sidhu, Honeywell to redefine air travel experience, The Star Online, Published Jun. 7, 2014, Printed online at: http://www.thestar.com.my/Business/Business-News/2014/06/07/Honeywell-to-redefine-air-travel-experience/, 6 pages.

* cited by examiner

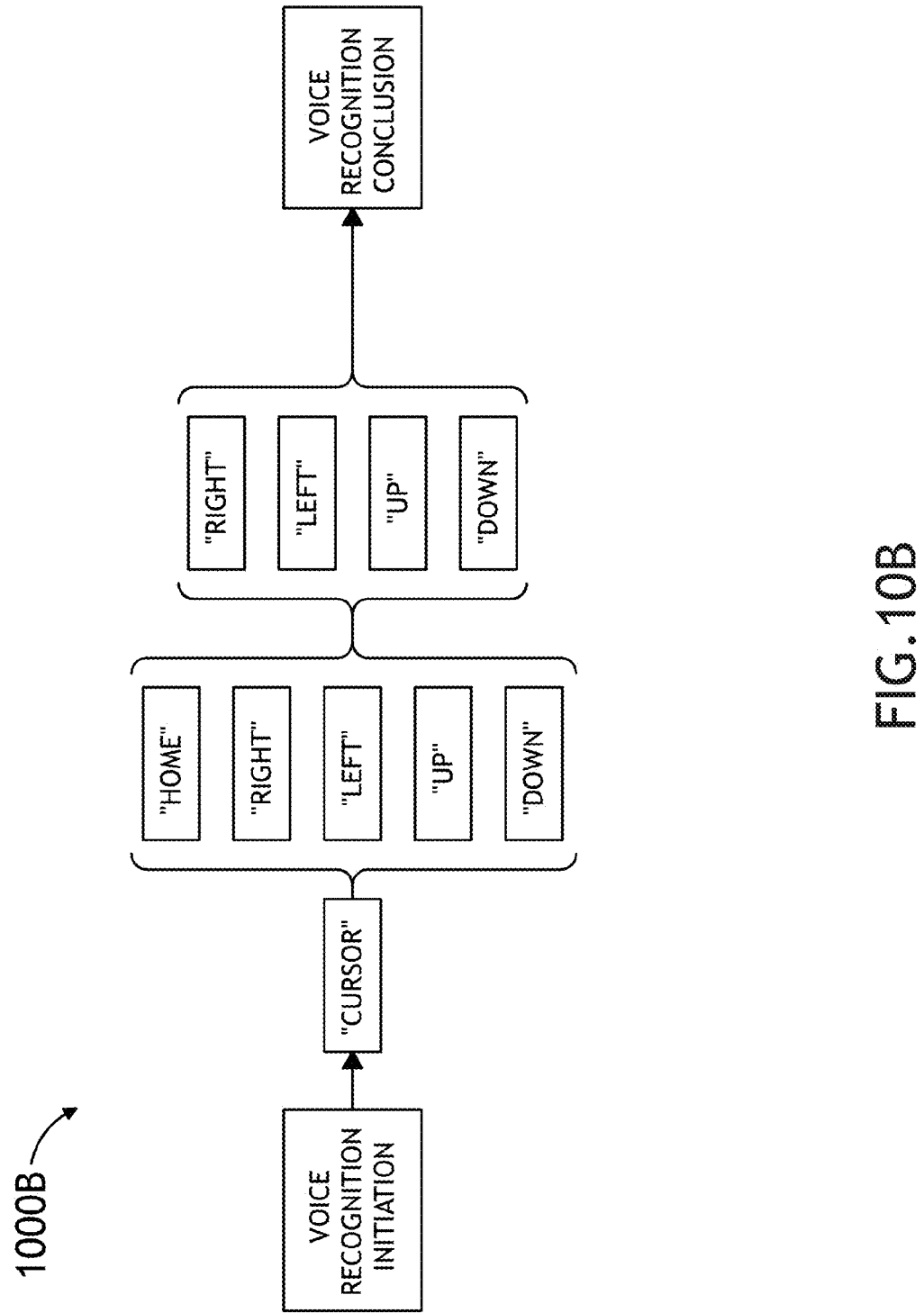

us 9,432,611 B1

VOICE RADIO TUNING

CROSS-REFERENCE TO RELATED APPLICATIONS

The present application is related to U.S. patent application Ser. No. 13/248,814, filed on Sep. 29, 2011; the present application is related to U.S. patent application Ser. No. 14/013,883, filed on Aug. 29, 2013; the present application is related to U.S. patent application Ser. No. 14/038,249, filed on Sep. 26, 2013; the present application is related to U.S. patent application Ser. No. 14/458,838, filed on Aug. 13, 2014; the present application is related to U.S. patent application Ser. No. 14/038,406, filed on Sep. 26, 2013; the present application is related to U.S. patent application Ser. No. 14/038,439, filed on Sep. 26, 2013.

U.S. patent application Ser. Nos. 13/248,814, 14/013,883, 14/038,249, 14/458,838, 14/038,406, and 14/038,439 are herein incorporated by reference in their entirety.

FIELD

Embodiments are directed generally toward a method, apparatus, and system for utilizing voice recognition for operations in aircraft systems.

BACKGROUND

Currently, avionics systems use display radio tuning formats to allow pilots to tune radios or use dedicated radio tuning hardware in an aircraft. Use of display radio tuning requires pilots to change the displayed content of the flight displays to tune radios. Changing the displayed content of flight displays requires a pilot to pull his head down to look at the display and manually select the radio tuning content to be displayed, enter a tuning frequency, and select a radio. Tuning the radio manually can be challenging in a single pilot aircraft. Radio tuning is often considered the most frequent pilot task, and it would be advantageous to reduce the workload associated with performing radio tuning. Further, many systems require a display format change to display the radio tuner prior to each time a pilot actually tunes the radio. Having to change the display format each time the radio needs to be tuned represents a significant workload that distracts the pilot or delays the pilot from performing other flight tasks. Additionally, upon completion of tuning the radio, the pilot has to exit the radio tuner displayed content to return to displaying the previously displayed content.

SUMMARY

In one aspect, embodiments of the inventive concepts disclosed herein are directed to a method. A method includes receiving text data corresponding to user speech recognized by a voice recognition system. The method also includes determining a desired radio and a desired radio frequency based at least on the text data. Additionally, the method includes performing one or more radio tuning operations to tune the desired radio to the desired radio frequency.

Additional embodiments are described in the application including the claims. It is to be understood that both the foregoing general description and the following detailed description are exemplary and explanatory only and are not restrictive. Other embodiments will become apparent.

BRIEF DESCRIPTION OF THE FIGURES

Other embodiments will become apparent by reference to the accompanying figures in which:

FIG. 10B depicts a flow diagram of an additional voice recognition sequence for performing cursor control operations of one embodiment.

DETAILED DESCRIPTION

Reference will now be made in detail to the subject matter disclosed, which is illustrated in the accompanying drawings. The scope of the disclosure is limited only by the claims; numerous alternatives, modifications, and equivalents are encompassed. For the purpose of clarity, technical material that is known in the technical fields related to the embodiments has not been described in detail to avoid unnecessarily obscuring the description.

Embodiments are configured to utilize voice recognition technology to allow a pilot to tune radios without the use of display formats. Embodiments allow a pilot to tune radios by using simple voice commands. Embodiments allow a crew to tune radios to selected frequencies without needing to move a cursor or changing display formats while focusing on other flight tasks.

Figure 1:
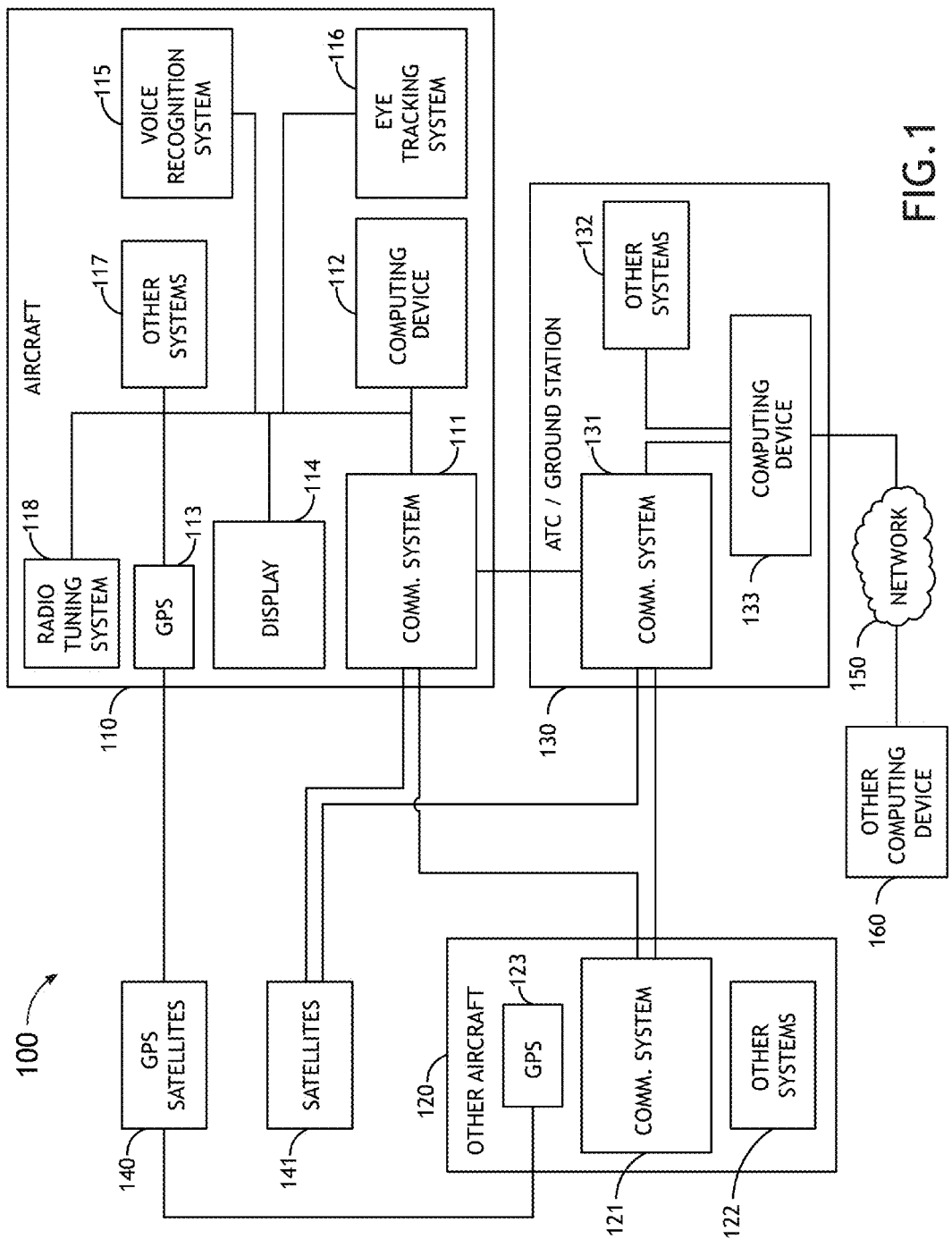
FIG. 1 shows a system topology of one embodiment.

Referring now to FIG. 1, an overall system diagram of one embodiment is depicted. The system 100 includes an aircraft 110, an air traffic control station or ground station 130, and global positioning system (GPS) satellites 140. Some embodiments further include other aircraft 120, satellites 141, a network 150, and other computing device 160.

In one embodiment, the aircraft 110 includes a communication system 111, a computing device 112, a global positioning system (GPS) device 113, a display 114, a voice recognition system 115, an eye tracking system 116, a radio tuning system 118, as well as other systems 117, equipment, and devices commonly included in aircraft. In some embodiments, some or all of the communication system 111, the computing device 112, the global positioning system (GPS) device 113, the display 114, the voice recognition system 115, the eye tracking system 116, the radio tuning system 118, and/or the other systems 117 are communicatively coupled.

In one embodiment, the communication system 111 is configured to send and/or receive signal, data, and/or voice transmissions to and/or from other aircraft 120, an air traffic control station or ground station 130, satellites 141, or combinations thereof. For example, the communication system 111 may include a transceiver and an antenna. An exemplary suitable transceiver may include a radiofrequency signal emitter and receiver; such exemplary transceiver may be configured to transmit or broadcast signals to other aircraft (e.g., the other aircraft 120), air traffic control/ground stations 130, or the like. In one embodiment, the transceiver may be implemented as a universal access transceiver (UAT) configured to send and receive automatic dependent surveillance-broadcast (ADS-B) signals. Additionally, in some embodiments, the communication system 111 includes a communication radio configured to send and receive voice communications to/from other aircraft 120, air traffic control/ground stations 130, or combinations thereof. In some embodiments, the communication system 111 includes or is implemented as radio(s) 840, as shown in and described in more detail with respect to FIGS. 8A-C.

In one embodiment, the radio tuning system 118 is configured to tune the communication system 111 to send and/or receive desired radio frequency signals. The radio tuning system 118 may include at least one processor configured to run various software applications or computer code stored in a non-transitory computer-readable medium and configured to execute various instructions or operations.

In one embodiment, the GPS device 113 receives location data from the GPS satellites 40 and may provide the location data to any of various equipment/systems of the aircraft 110 (e.g., the communication system 111, the computing device 112, the display 114, and/or any of the other systems 117 of the aircraft 110). For example, the GPS device 113 may receive or calculate location data from a sufficient number (e.g., at least four) of GPS satellites 140 in view of the aircraft 110 such that a GPS solution may be calculated.

In one embodiment, the display 114 may include projectors (such as an image projector, a retina projector, or the like), liquid crystal cells, and/or light emitting diodes (LEDs). Exemplary display devices may include a weather display overlay, a head-up display (HUD), a head-down display, a head-mounted display (HMD), an integrated display system, and/or the like. In some embodiments, the display 114 includes a touchscreen display. In some embodiments, the display 114 includes one or more components of a flight control panel.

In one embodiment, the other systems 117 of the aircraft 110 include a flight management system (e.g., 830), a weather radar system, an auto-flight system, an autopilot system, a traffic collision avoidance system (TCAS), an altimeter (e.g., a radio altimeter), and/or the like.

In one embodiment, the other aircraft 120 includes a communication system 121, a GPS device 123, as well as other systems 122, equipment, and devices commonly included in aircraft, as similarly described with reference to the aircraft 110 above.

In one embodiment, the air traffic control or ground station 130 includes a communication system 131, at least one (e.g., one, two, three, . . . one-hundred, or more) computing device 133, as well as other systems 132, equipment, and devices commonly included in an air traffic control or ground station 130. The communication system 131 may be configured to receive and/or transmit signals from and/or to aircraft (e.g., aircraft 110, other aircraft 120). Additionally, the computing device 133 may be communicatively coupled to an input device (e.g., mouse, keyboard, microphone, or the like), an output device (e.g., a display, speaker, or the like), or an input/output device (e.g., a touch-screen display, or the like) configured to interface with a user. For example, a particular computing device 133 may be configured to output data to an output device for presentation to a user, and the particular computing device 133 may be further coupled to an input device configured to receive input data from a user. In one embodiment, some or all of a plurality of computing devices (e.g., 133) are communicatively coupled to each other. In further embodiments, one or more of the at least one computing device 133 is communicatively connected to at least one other computing device 160 via one or more networks 150 (e.g., internet, intranet, or the like). For example, the other computing device 160 may comprise a computing device at a different air traffic control station or a different ground station.

Figure 2:
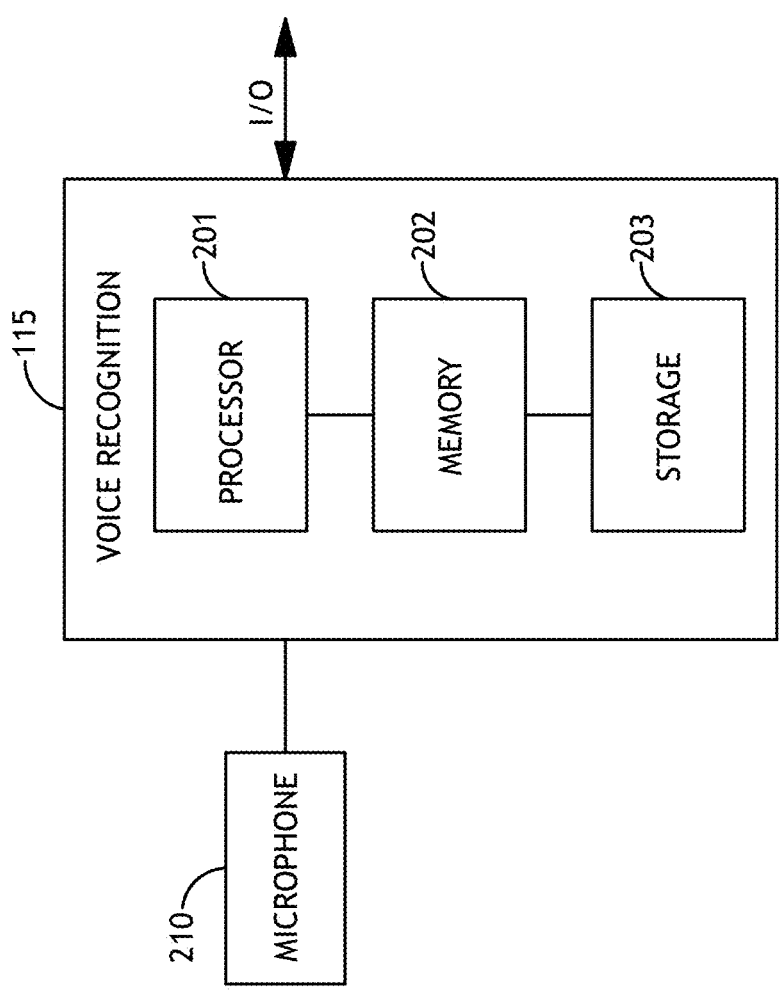
FIG. 2 depicts a voice recognition system coupled to a microphone of one embodiment.

Referring now to FIG. 2, a voice recognition system 115 of an aircraft 110 coupled to a microphone 210 of one embodiment is shown. The voice recognition system 115 is configured to recognize voice commands or audible inputs of a user. In one embodiment, the voice recognition system 115 includes at least one (e.g., one, two, or more) processor 201, memory 202, and storage 203, as well as other components, equipment, and/or devices commonly included in a voice recognition system 115. The processor 201, the memory 202, the storage 203, the microphone 210, as well as the other components, equipment, and/or devices commonly included in a voice recognition system 115 may be communicatively coupled. In some embodiments, the voice recognition system 115 is coupled to the microphone 210 and/or includes a dedicated microphone.

Figure 4:
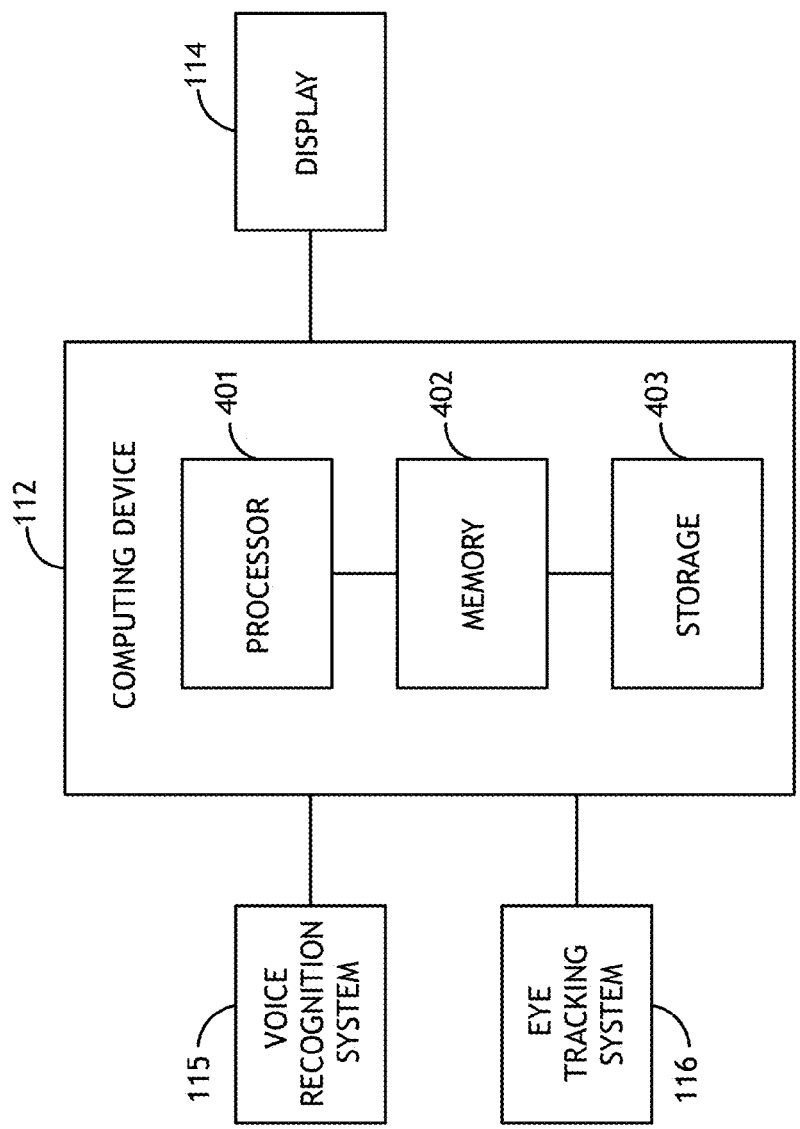
FIG. 4 depicts a computing device coupled to a voice recognition system, an eye tracking system, and a display of one embodiment.

The processor 201 may be configured to process data received from the microphone 210 and output processed data (e.g., text data) to one or more output devices (e.g., the computing device 112, the display 114, or the like) and/or output the processed data to another system of the aircraft 110, such as the radio tuning system 118. For example, the processor 201 may be configured to output processed data (e.g., text data) to the radio tuning system 118 for tuning a selected radio to a particular frequency. Additionally, the processor 201 may be configured to output processed data (e.g., text data) to the communication system 111 so that the processed data may be sent to other aircraft 120, an air traffic control station or ground station 130, satellites 141, or combinations thereof. Similarly, the processor 201 of the voice recognition system 115 may be configured to provide processed data (e.g., text data) to a computing device 112 of the aircraft 110, as shown in FIG. 4. Exemplary embodiments may include the voice recognition system 115 being configured for performing fully automatic voice recognition operations of users in real time.

As shown in FIG. 2, the processor 201 of the voice recognition system 115 may be configured to run various software applications or computer code stored in a non-transitory computer-readable medium and configured to cause the processor 201 to execute various instructions or operations.

Figure 3:
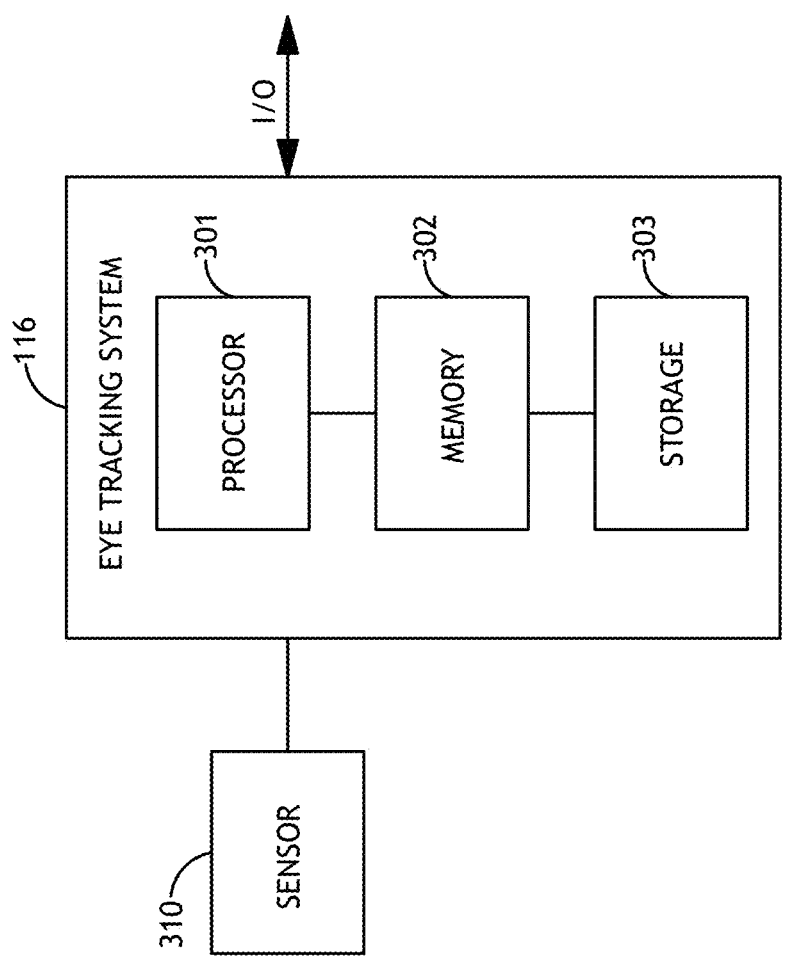
FIG. 3 depicts an eye tracking system coupled to a sensor of one embodiment.

Referring now to FIG. 3, an eye tracking system 116 of an aircraft 110 coupled to at least one sensor 310 is shown. In one embodiment, the eye tracking system 116 is configured to track eye gestures, movement of a user's eye, a user's gaze, or otherwise receive inputs from a user's eye. In one embodiment, the eye tracking system 116 includes at least one (e.g., one, two, or more) processor 301, memory 302, and storage 303, as well as other components, equipment, and/or devices commonly included in an eye tracking system 116. The processor 301, the memory 302, the storage 303, the at least one sensor 310, as well as the other components, equipment, and/or devices commonly included in an eye tracking system 116 may be communicatively coupled. In one embodiment, the eye tracking system 116 is coupled to a sensor 310 and/or includes one or more dedicated sensors. The sensor 310 may comprise at least one camera.

The processor 301 may be configured to process data received from the sensor 310 and output processed data to one or more output devices (e.g., the computing device 112, the display 114, or the like) and/or output the processed data to another system of the aircraft 110, such as the radio tuning system 118. For example, the processor 301 may be configured to output processed data to the radio tuning system 118 for selecting a particular radio to tune based on a user's gaze. Additionally, for example, the processor 301 may be configured to output processed data to the communication system 111 so that the processed data may be sent to other aircraft 120, an air traffic control station or ground station 130, satellites 141, or the like. Similarly, the processor 301 of the eye tracking system 116 may be configured to provide data to the computing device 112 of the aircraft 110, as shown in FIG. 4. The eye tracking system 116 may be configured for performing fully automatic eye tracking operations of users in real time.

As shown in FIG. 3, the processor 301 of the eye tracking system 116 may be configured to run various software applications or computer code stored in a non-transitory computer-readable medium and configured to execute various instructions or operations.

Referring now to FIG. 4, a computing device 112 of the aircraft 110 coupled to a voice recognition system 115, an eye tracking system 116, and at least one display 114 of one embodiment is shown. In one embodiment, the computing device 112 includes at least one (e.g., one, two, or more) processor 401, memory 402, and storage 403, as well as other components, equipment, and/or devices commonly included in a computing device. The processor 401, the memory 402, the storage 403, as well as the other components, equipment, and/or devices commonly included in a computing device may be communicatively coupled. In one embodiment, the computing device 112 is coupled to the voice recognition system 115, the eye tracking system 116, and the display 114. In other embodiments, the computing device 112 includes one or more of the voice recognition system 115, the eye tracking system 116, the radio tuning system 118, and the display 114.

The processor 401 may be configured to process data received from the voice recognition system 115 and/or the eye tracking system 116 and output processed data to one or more output devices (e.g., the display 114, or the like) and/or output the processed data to another system of the aircraft 110, such as the radio tuning system 118. For example, the processor 401 may be configured to output processed data to the communication system 111 so that the processed data may be sent to other aircraft 120, an air traffic control station or ground station 130, satellites 141, or the like.

Additionally, the computing device 112 may be communicatively coupled to one or more input devices (e.g., mouse, pointing device, joystick, keyboard, microphone, sensor, camera, electroencephalograph (EEG) sensors, or the like), an output device (e.g., a display, speaker, or the like), or an input/output device (e.g., a touch-screen display, or the like) configured to interface with a user (e.g., a pilot). For example, a particular computing device 112 may be configured to output data to an output device (e.g., the display 114) for presentation to a user, and a particular computing device 112 may be further coupled to an input device configured to receive input data from a user.

As shown in FIG. 4, the processor 401 of the computing device 112 may be configured to run various software applications or computer code stored in a non-transitory computer-readable medium and configured to execute various instructions or operations.

Figure 5:
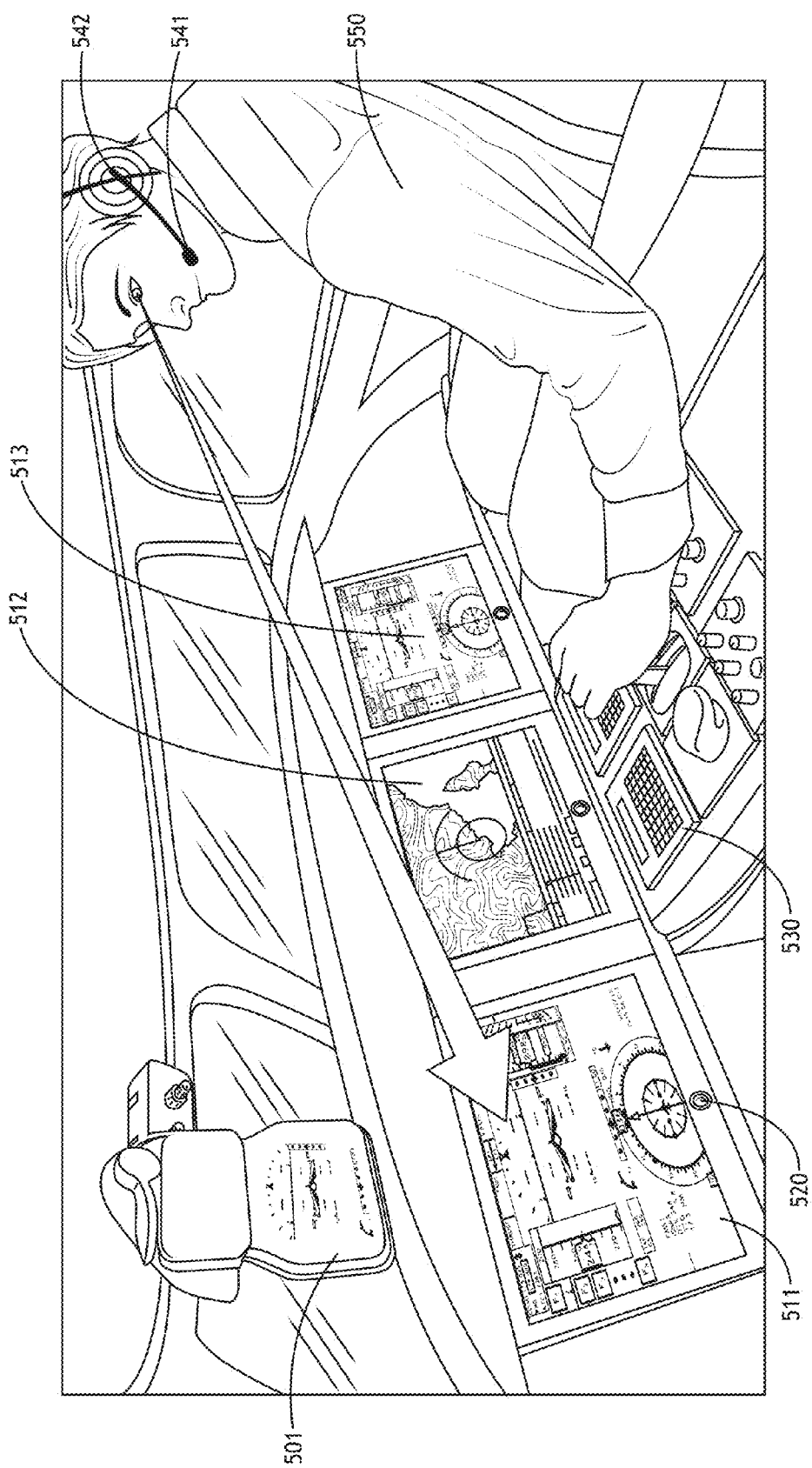
FIG. 5 depicts a partial view of a cockpit of an aircraft of one embodiment.

Referring now to FIG. 5, a partial view of a cockpit of the aircraft 110 of one embodiment is depicted. A user 550 (e.g., a pilot, a copilot, a navigator, or the like) can interface with various components of the cockpit. In one embodiment, the cockpit includes displays (such as a HUD 501, a first display 511, a second display 512, a third display 513, and/or the like), a sensor (such as one or more cameras 520, or the like), a key pad 530 (such as an MKP, a keyboard, and/or the like), a microphone (such as a headset microphone 541, or the like), and a speaker (such as a head set speaker 542, or the like) as well as other components, equipment, and/or devices commonly included a cockpit. In some embodiments, the displays 501, 511, 512, 513, the sensor 310, the key pad 530, the microphone (such as the headset microphone 541, or the like), and the speaker (such as a head set speaker 542, or the like) as well as the other components, equipment, and/or devices commonly included a cockpit may be implemented as part of and/or communicatively coupled to one or more of the communication system 111, the computing device 112, the global positioning system (GPS) device 113, the display 114, the voice recognition system 115, the eye tracking system 116, the radio tuning system 118, as well as other systems 117, equipment, and devices commonly included in aircraft 110. For example, one of the displays 501, 511, 512, 513 may be configured to display a radio tuning graphical user interface (GUI) (e.g., 803 as shown in FIG. 8D).

Figure 6:
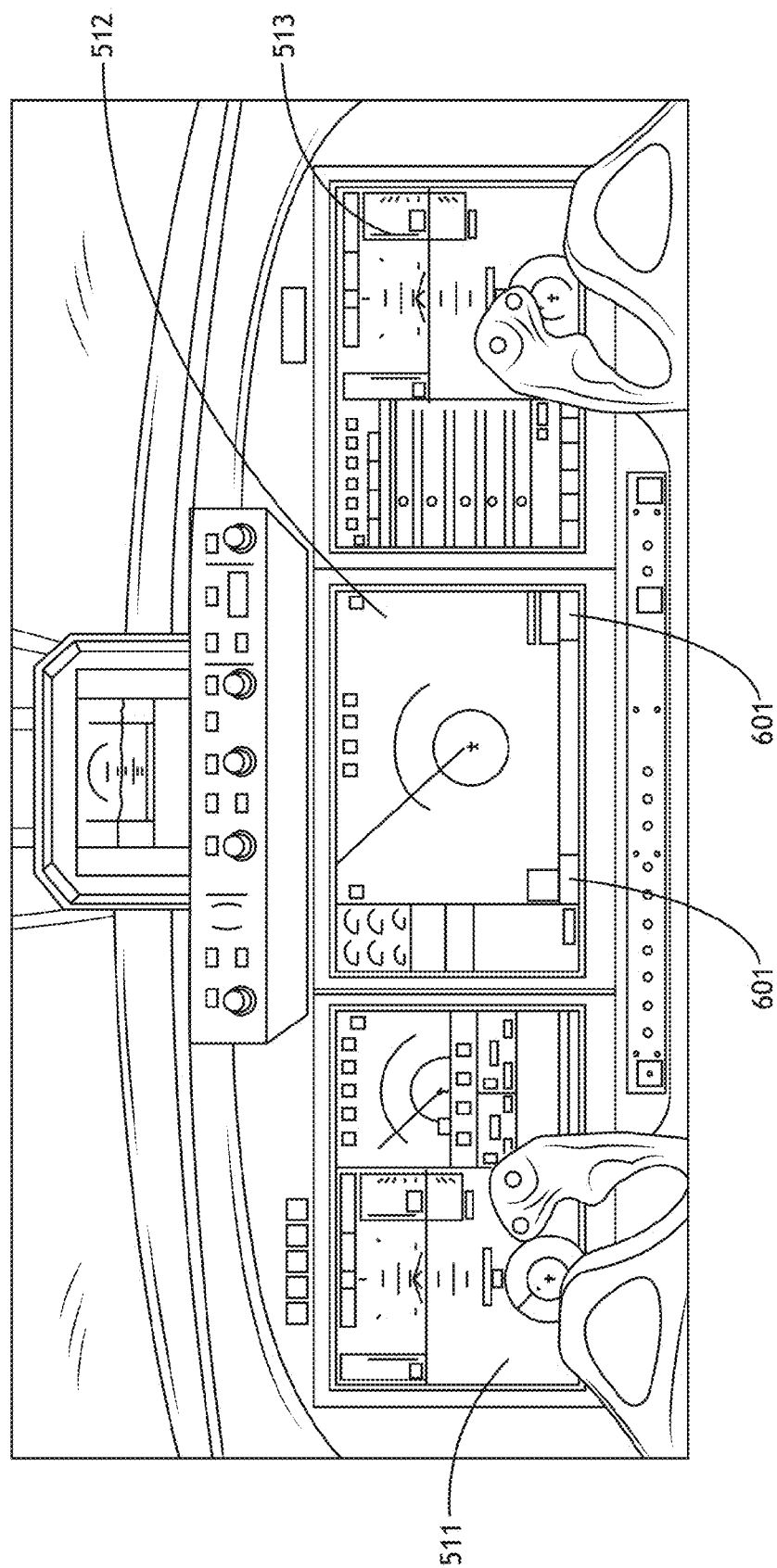
FIG. 6 depicts a further partial view of a cockpit of an aircraft of one embodiment.

Referring now to FIG. 6, a partial view of a cockpit of the aircraft 110 of a further exemplary embodiment is depicted. In some embodiments, displays (such as a first display 511, a second display 512, a third display 513, and/or the like) include one or more text buffers 601. In some embodiments, the one or more text buffers 601 may include or may be implemented as one or more "scratchpads" configured to temporarily store and display textual contents. For example, one of the text buffers 601 may display a recognized voice command as textual data for verification by a pilot, and once the pilot verifies the displayed textual data, the voice command may be forwarded to the radio tuning system 118 as instructions to perform a radio tuning operation.

Figure 7:
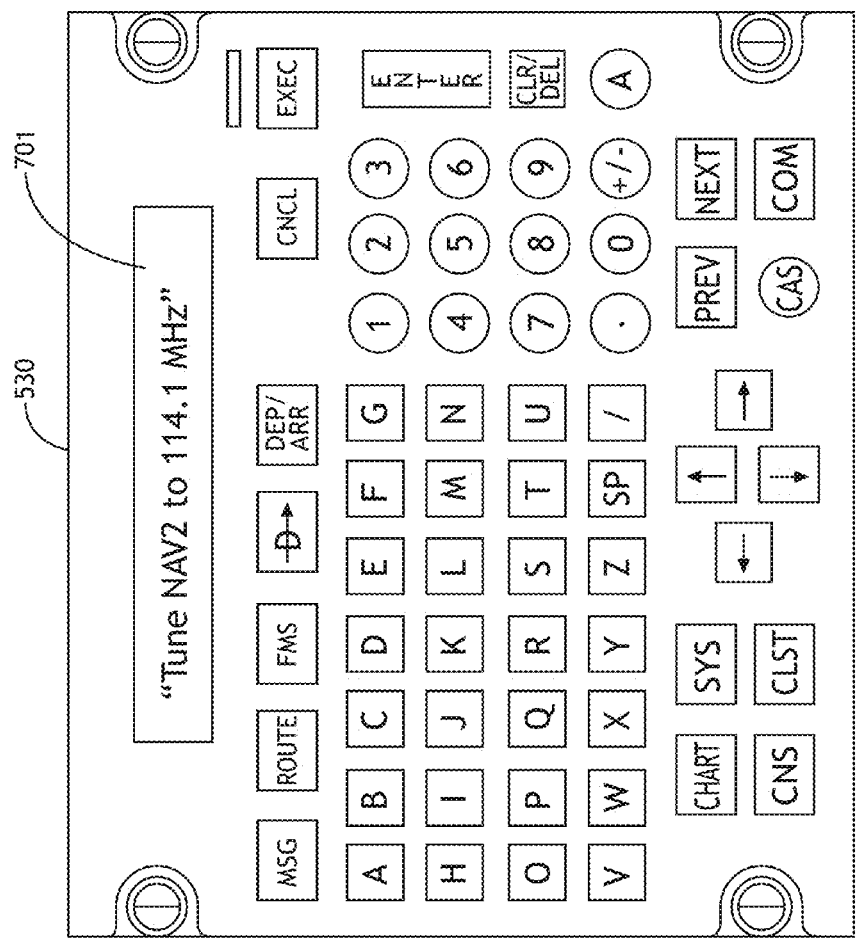
FIG. 7 depicts a keypad of one embodiment.

Referring now to FIG. 7, a keypad 530 of one embodiment is shown. The keypad 530 may comprise an MKP, a CCP, or the like. The keypad 530 may include at least one text buffer 701. In some embodiments, the at least one text buffer 701 may include or may be implemented as one or more "scratchpads" configured to temporarily store and display textual contents. As shown in FIG. 7, the text buffer 701 displays "Tune NAV2 to 114.1 MHz" in response to a voice recognition system 115 recognizing user speech of, for example, "ONE ONE FOUR POINT ONE NAV TWO" and the voice recognition system 115 formatting the recognized user speech to a suitably ordered (e.g., ordered according to natural language conventions) corresponding textual phrase (e.g., "Tune NAV2 to 114.1 MHz"). In response to the text buffer displaying the "Tune NAV2 to 114.1 MHz", a user may verify that the voice command is correct through an additional user input (e.g., a voice command, eye tracking command, button press, or the like) that is detected by a particular system component (e.g., the voice recognition system 115, the eye tracking system 116, the keypad 530, or the like), and the command is output to the radio tuning system 118 instructing the radio tuning system 118 to perform the radio tuning operation.

Figure 8A:
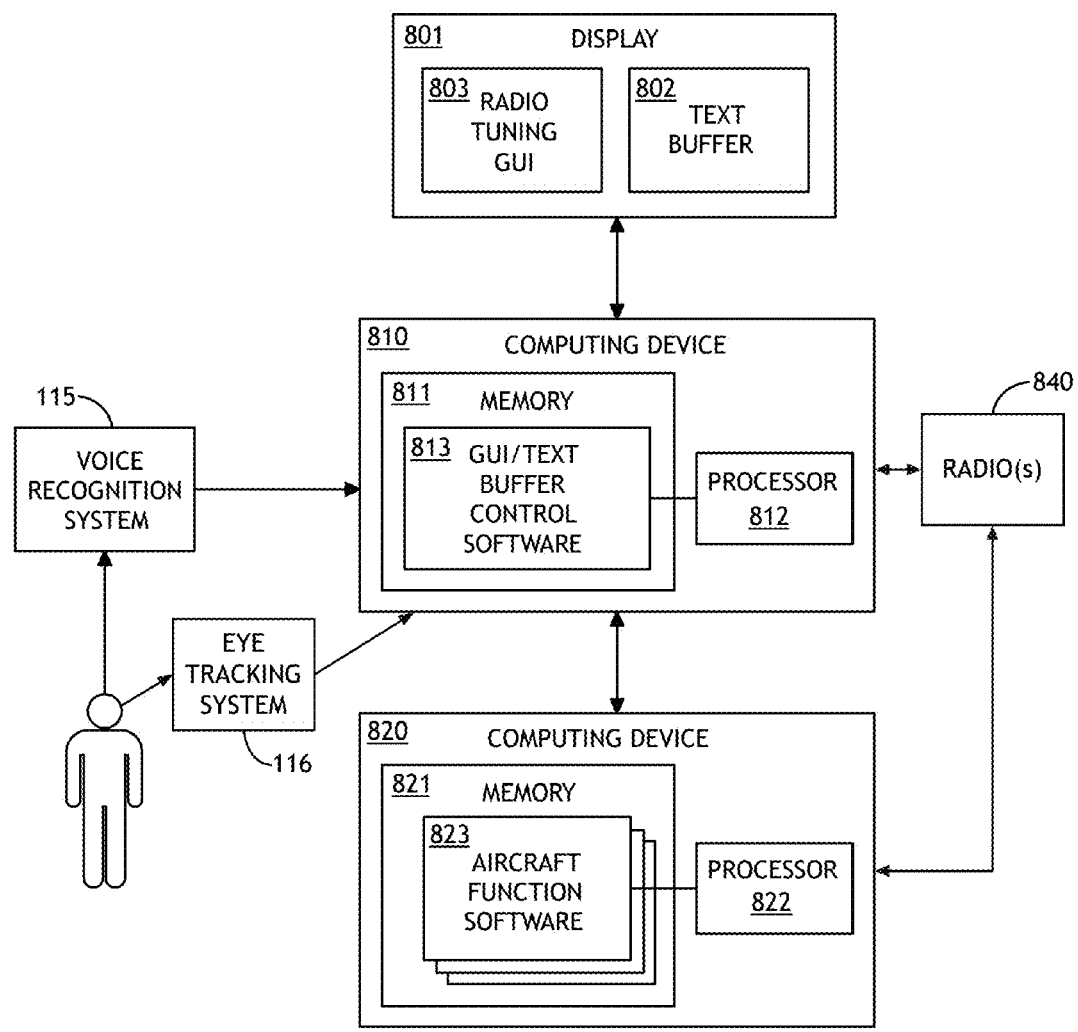
FIG. 8A depicts a system diagram of one embodiment.

Referring now to FIG. 8A, a system diagram of one embodiment is shown. The aircraft may include a voice recognition system 115, a display 801, a first computing device 810, a second computing device 820, an eye tracking system 116, and radio(s) 840, which are communicatively coupled with one another and with the display 801. In one embodiment, the display 801 includes a text buffer 802 (e.g., text buffer 601 of display 512); in other embodiments, the text buffer 802 may be implemented as a dedicated display or implemented as a display of another device (e.g., text buffer 701 implemented on a keypad 530). In one embodiment, the display 801 is configured to display a radio tuning graphical user interface (GUI) 803.

The first computing device 810 may include GUI/text buffer control software 813 stored in a non-transitory processor-readable medium (e.g., memory 811) and a processor 812. The processor 812 may be configured to execute instructions of the GUI/text buffer control software 813 to perform various operations. The processor 812 may be configured to receive text data from the voice recognition system 115. In some embodiments, the processor 812 may be configured to process the received text data and output instructions to a destination device (e.g., the second computing device 820) to perform any of various operations (e.g., radio tuning operations); in some embodiments, the processor 812 may be configured to route the received text data directly to a destination device (e.g., the second computing device 820) for further processing by the destination device; in still other embodiments, the processor 812 may be configured to output or display the received text data to or on the text buffer 802.

In some embodiments, the processor 812 may further be configured to manage the contents of a text buffer 802 (e.g., a scratchpad). The processor 812 may further be configured to update the content of the text buffer 802 based on the received text data from the voice recognition system 115. The processor 812 may be configured to receive user verification of the contents of the text buffer 802 and to receive a command from the user with instructions of where (e.g., a destination, such as the second computing device 820) to output the contents of the text buffer 802. Additionally, the processor 812 may be configured to output the contents of the text buffer 802 to a selected portion of the display 801. The processor 812 may also receive a command (e.g., a voice command, an eye tracking command from the eye tracking system 116, a command from another input device, or the like) to output the contents of the text buffer 802 to the second computing device 820, which contains processor 822 configured to execute instructions of aircraft function software 823. Further, in some embodiments, where the eye tracking system 116 contributes to selecting a destination, a computing device is configured to output (e.g., overlay on the GUI of a display) on the display 801 a current location detected by the eye tracking system 116 of a pilot's gaze so that the pilot may compensate for any offset between the eye tracking system's 116 detected gaze location and the pilot's actual focus point and/or so that the pilot may confirm the eye tracking system's 116 detected gaze location. For example, such a command may be generated upon a user selecting a particular text input box on the display 801 through operation of a cursor control device, touchscreen, voice recognition system 115, eye tracking system 116, keypad 530, or other input device.

The GUI/text buffer control software 813 may comprise one or more software applications or computer code stored in a non-transitory computer-readable medium 811 configured for performing various instructions or operations when executed by the processor 812. For example, execution of the GUI/text buffer control software 813 by the processor 812 may cause the processor 812 to output graphical data to the display 801. Execution of the GUI/text buffer control software 813 by the processor 812 may cause the processor 812 to output graphical data associated with any of various systems or devices (e.g., radio tuning system 118, a flight management system (FMS) 830, text buffer 802, etc.) to be displayed to the user. The display 801 may display images corresponding to the graphical data as, for example, the radio tuning GUI 803 and the text buffer 802.

The second computing device 820 may include aircraft function software 823 stored in a non-transitory processor-readable medium (e.g., memory 821) and a processor 822. The processor 822 may be configured to execute instructions of the one or more aircraft function software 823 to perform various operations. The processor 822 may be configured to perform any of various operations associated with an aircraft, a particular system of the aircraft, or the like. In some embodiments, the processor 822 is configured to execute instructions of software configured to perform operations associated with any of various aircraft systems (e.g., a flight management system (FMS) 830, a weather radar system, an attitude and heading reference system (AHRS), a traffic collision avoidance system (TCAS), a radio tuning system 118, an auto-flight system, an autopilot system, or the like). For example, the second computing device 820 may include, be implemented as, or be implemented with the functionality of a radio tuning system 118, and the one or more aircraft function software 823 may include a radio tuning system application that, when executed by the processor 822, performs radio tuning operations to tune the radio(s) 840 in response to voice commands or text data received from (e.g., directly from or indirectly from) the voice recognition system 115. For example, where the processor 822 is configured to perform radio tuning operations, the processor 822 may a) receive data (e.g., text data associated with voice radio tuning commands) from (e.g., directly from or via the first computing device 810) the voice recognition system 115, b) perform one or more radio tuning operations based on the data (e.g., text data associated with voice radio tuning commands) to determine a particular radio 840 to tune and to determine a desired frequency to which the particular radio 840 is to be tuned, and c) output radio tuning instructions or signals to the radio(s) 840 to tune the particular radio to the desired frequency. Additionally, for example, if the processor 822 receives the contents (e.g., text data associated with voice radio tuning commands) of the text buffer 802, the processor 822 may utilize the contents of the text buffer 802 to perform one or more aircraft function operations (e.g., radio tuning operations) to determine a particular radio 840 to tune and to determine a desired frequency to which the particular radio 840 is to be tuned, and then a) output data or modified text content back to the processor 812 configured to execute the GUI/text buffer control software 813, b) output data directly to the display 801 for presentation on the display 801, such as presentation of a radio tuning GUI 803, c) output data to memory 822 for use by the processor 822 in executing instructions of another aircraft function software 823, d) output data to another system, e) output radio tuning instructions or signals to the radio(s) 840 to tune the particular radio 840 to the desired frequency, or the like.

For example, where the processor 822 is configured to perform radio tuning operations, the processor 822 may be configured to a) receive data (e.g., text data associated with voice radio tuning commands) from (e.g., directly from or via the first computing device 810) the voice recognition system 115, b) perform one or more radio tuning operations based on the data (e.g., text data associated with voice radio tuning commands) to determine a particular radio to tune and to determine a desired frequency to which the particular radio 840 is to be tuned, and c) output radio tuning instructions or signals to the radio(s) 840 to tune the particular radio 840 to the desired frequency.

The aircraft function software 823 may comprise one or more software applications (e.g., a radio tuning system application, FMS application, an auto-flight system application, an autopilot system application, or the like) or computer code stored in a non-transitory computer-readable medium (e.g., memory 822) configured for performing various instructions or operations when executed by processor 822.

In some embodiments, the second computing device 820 is implemented as a flight management system (FMS) 830, a weather radar system, an attitude and heading reference system (AHRS), a traffic collision avoidance system (TCAS), an auto-flight system, an autopilot system, a radio tuning system 118, or the like. Further, some embodiments include multiple second computing devices 820, which are communicatively coupled, and each second computing device 820 is implemented as a different computing device 820 configured to perform different operations (e.g., operations of a flight management system (FMS) 830, a weather radar system, an attitude and heading reference system (AHRS), a traffic collision avoidance system (TCAS), a radio tuning system 118, or the like).

While the GUI/text buffer software 813 and the aircraft performance software 823 are exemplarily depicted in FIG. 8A as running on separate computing devices, it is fully contemplated that the GUI/text buffer software 813 and the aircraft performance software 823 may be configured to run on a single computing device (e.g., computing device 810 or 820) or any number of computing devices in some embodiments. Likewise, in some embodiments, the voice recognition system 115, the GUI/text buffer software 813, and the aircraft performance software 823 may be configured to run on a single computing device (e.g., computing device 810 or 820) or any number of computing devices. Additionally, while the GUI/text buffer software 813 and the aircraft performance software 823 are exemplarily depicted as separate software, the GUI/text buffer software 813 and the aircraft performance software 823 may be implemented as a single software module or program or any number of software modules or programs.

The voice recognition system 115 may be configured to process user speech in real time. The voice recognition system 115 may be configured to recognize individual characters (e.g., alphanumeric characters, non-alphanumeric characters, American Standard Code for Information Interchange (ASCII) characters, Unicode characters, or the like), strings (e.g., two or more characters, such as words or numbers), and/or phrases of strings. For example, the voice recognition system 115 may be configured to recognize pilot phonetic alphabet voice inputs (e.g., "alpha", "bravo", "charlie", etc.) as individual characters, and/or the voice recognition system 115 may be configured to recognize whole words or phrases. The voice recognition system 115 may be configured to recognize user speech as text and output text data to the first computing device 810, the second computing device 820, the text buffer 802, another system (e.g., a radio tuning system 118), and/or the like. In some embodiments, the computing device 810 or 820 and/or the voice recognition system 115 may be configured to begin outputting recognized text data to the text buffer (e.g., 601, 701, or 802) upon recognition of an initiation command (such as recognition of a beginning keyword (e.g., "tune", "text", or the like), pressing an initiation button or icon, an eye tracking command, or the like) and end outputting recognized text data to the text buffer (e.g., 601, 701, or 802) upon recognition of an end command (e.g., such as recognition of an end keyword (e.g., "enter", "end", or the like), pressing an end button or icon, an eye tracking command, or the like). For example, a user's spoken phrase of "text one two one point three end" would output recognized text data of "121.3" to the text buffer (e.g., 601, 701, or 802). Additionally, in some embodiments, the computing device 810 or 820 and/or the voice recognition system 115 may be configured to recognize various control keywords (e.g., "clear", "delete", "change", or the like) for editing the contents of the text buffer (e.g., 601, 701, or 802). For example, recognition of the control keyword of "clear" may be configured to clear the contents of the text buffer, recognition of the control keyword of "delete" may be configured to delete the last string or character of the text buffer (e.g., 601, 701, or 802) contents, and recognition of the control keyword of "change" may be configured to change a particular string or character in the contents of the text buffer (e.g., 601, 701, or 802) to another string or character. Additionally, the computing device 810 or 820 and/or the voice recognition system 115 may be configured to recognize copy and/or paste commands. Recognition of a copy command (e.g., "copy to" "[destination]") may be configured to cause the contents of the text buffer (e.g., 601, 701, or 802) to fill a destination portion (e.g., a destination field) of the display 801. Additionally, for example, the contents of a first text buffer (e.g., text buffer 802) may be copied to the contents of a second text buffer (e.g., text buffer 601 or 701). Recognition of a paste command (e.g., "paste from" "[source]") may be configured to cause the contents of the text buffer (e.g., 601, 701, or 802) to be filled with the contents of a source portion (e.g., a source field) of the display 801. Further, the computing device 810 or 820 and/or the voice recognition system 115 may be configured to recognize routing commands configured to send the contents of the text buffer (e.g., 601, 701, or 802) to another on-board or off-board system (e.g., a radio tuning system 118), one or more aircraft function software 823 (e.g., a radio tuning application), or the like. Also, the computing device 810 or 820 may be configured to fill the contents of a text buffer (e.g., 601, 701, or 802) received from multiple text input sources, such as text inputs received from a voice recognition system 115 and text inputs from a keypad 530.

While the first computing device 810, the second computing device 820, the voice recognition system 115, and the eye tracking system 116 are depicted as separate devices in FIG. 8A, in some embodiments the first computing device 810, the second computing device 820, the voice recognition system 115, and the eye tracking system 116 may be implemented as a single computing device or on any number of computing devices.

Figure 8B:
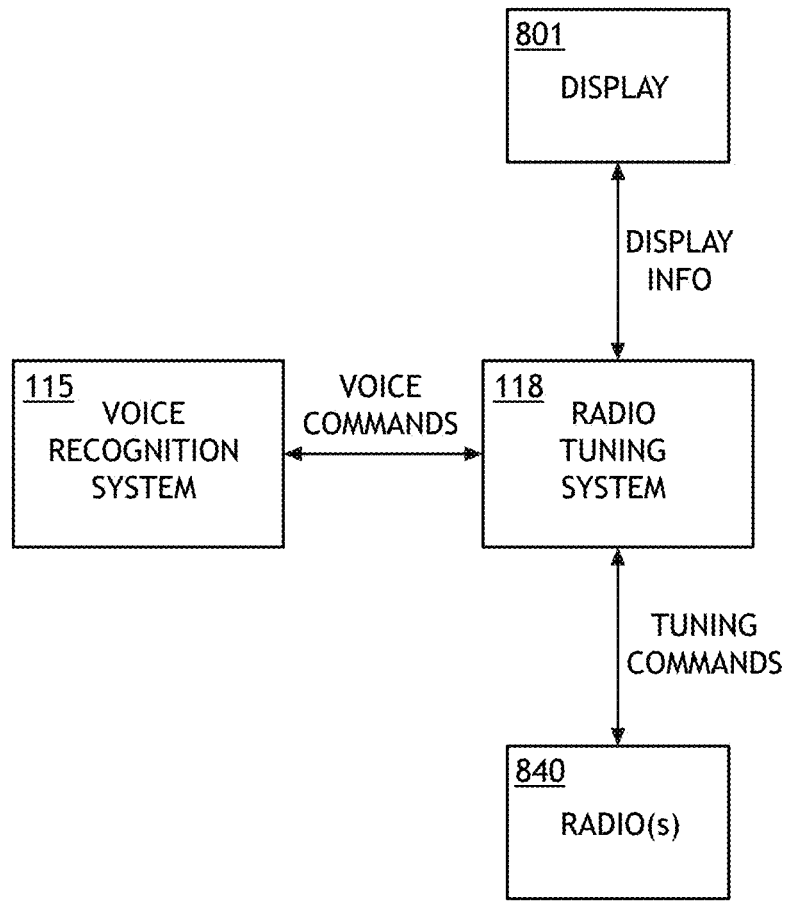
FIG. 8B depicts a further system diagram of one embodiment.
Figure 8C:
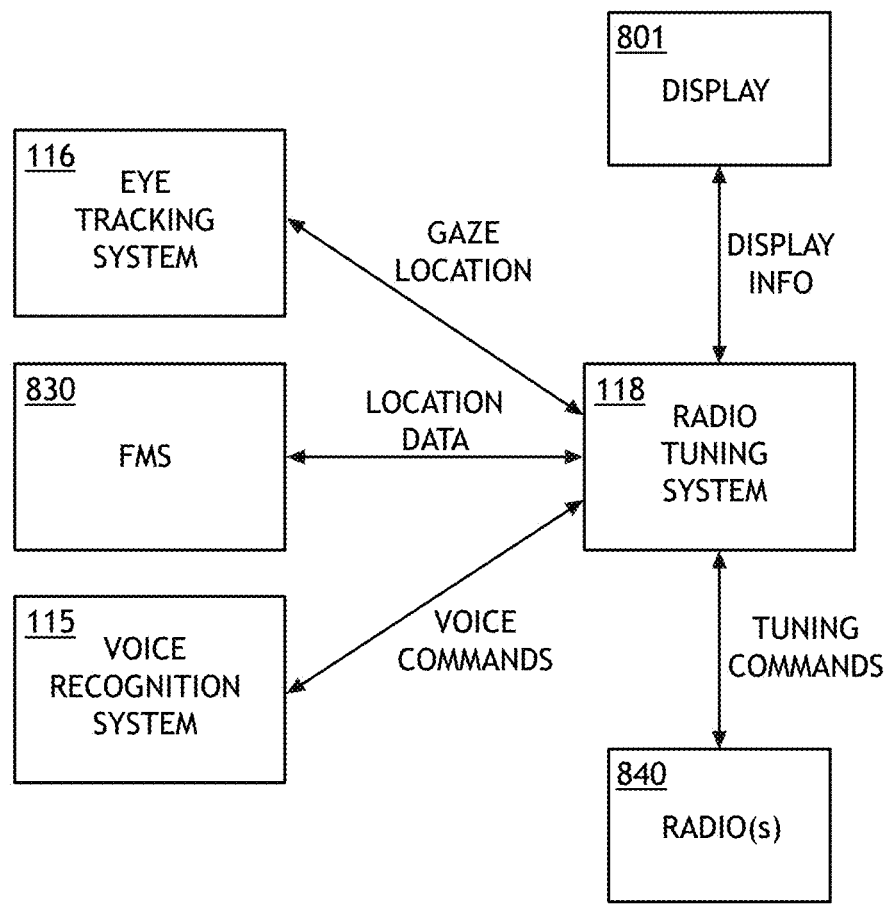
FIG. 8C depicts a further system diagram of one embodiment.
Figure 8D:
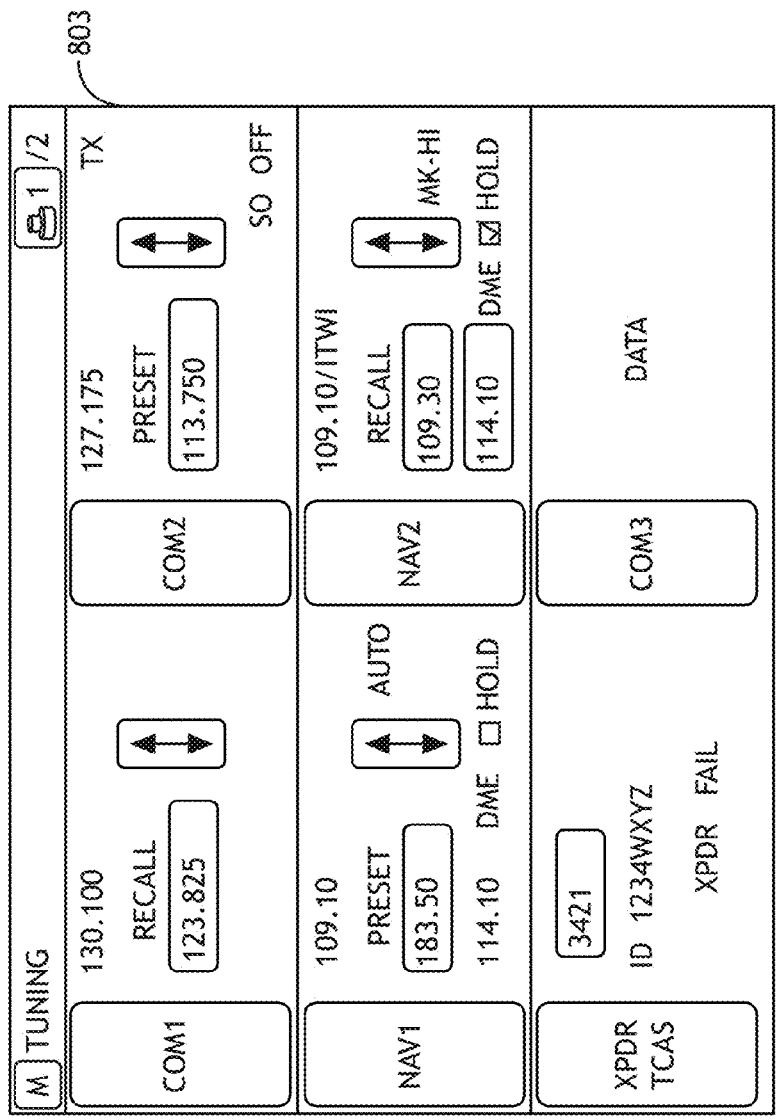
FIG. 8D depicts a radio tuning graphical user interface of one embodiment.

Referring now to FIGS. 8B-D, system diagrams of a system configured for performing voice radio tuning operations of some embodiments are shown. As shown in FIG.

8B, the system may include a voice recognition system 115, a display 801, a radio tuning system 116, and radio(s) 840, which are communicatively coupled with one another and with the display 801. In one embodiment, the display 801 is configured to display a radio tuning graphical user interface (GUI) 803 as shown in FIG. 8D. As shown in FIG. 8C, the system may optionally include one or more other systems (such as an eye tracking system 116, another user input device, an FMS 830, or the like) coupled to one or more of the voice recognition system 115, the display 801, the radio tuning system 116, and the radio(s) 840.

The voice recognition system 115 may be configured to recognize user speech and output text data corresponding to or associated with the user speech to the radio tuning system 118. In some embodiments, the voice recognition system 115 may be configured to begin outputting recognized text data to the radio tuning system 118 upon recognition of an initiation command (such as recognition of a beginning keyword (e.g., "tune", "text", or the like), pressing an initiation button or icon, an eye tracking command, or the like) and end outputting recognized text data to the radio tuning system 118 upon recognition of an end command (e.g., such as recognition of an end keyword (e.g., "enter", "end", or the like), pressing an end button or icon, an eye tracking command, or the like).

The radio tuning system 118 may be configured to receive data (e.g., text data) associated with voice radio tuning commands from (e.g., directly or indirectly from) the voice recognition system 115 and/or other systems (e.g., eye tracking system 116 or other user input device, an FMS 830, or the like). The radio tuning system 118 is configured to perform any of various radio tuning operations in response to receiving the text data from the voice recognition system 118 and/or the data from other systems. For example, the radio tuning system 118 may process the text data and/or the data from other systems. Processing the text data may include parsing the text data to identify a radio identifier, a frequency identifier, and/or other text data (e.g., text data (e.g., "eye", "look", "touch", or the like) associated with a command to reference another system (e.g., reference a gaze location detected by the eye tracking system 116)) indicated by the text data. Processing the text data may include determining a desired (e.g., selected, associated, or the like) radio and determining a desired (e.g., selected, associated, or the like) radio frequency. For example, the radio tuning system 118 may determine a desired radio to tune based on a textual radio identifier or based on a gaze location detected by the eye tracking system 116. Processing the text data and/or the data from other systems may further include determining a desired radio frequency to which a desired radio is to be tuned based on a frequency identifier, based on a gaze location detected by the eye tracking system 116, and/or based on a frequency associated with a particular current or sequenced location (e.g., a current waypoint, a previous waypoint, a next waypoint, or the like) of a flight plan, for example, received from the FMS 830.

In some embodiments, the radio identifier is a static radio identifier or a referenced radio identifier. Static radio identifiers are statically specified radio identifiers recognizable by the radio tuning system from the text data, and the static radio identifier refers to a particular radio 840 that may be looked up in a data structure stored in a non-transitory computer-readable medium that contains static radio identifiers and associated radios. For example, a static radio identifier may be a multi-character static radio identifier (such as, "COM1", "COM2", "NAV1", "NAV2", "HF", "ADF", or the like) associated with a particular radio 840 (e.g., communication radio 1 (COM1) for a pilot, communication radio 2 (COM2) for a copilot, navigation radio 1 (NAV1) for a pilot, navigation radio 2 (NAV2) for a copilot, high frequency (HF) radio, automatic direction finder (ADF) radio, respectively, or the like) of the radio(s) 840.

On the other hand, referenced radio identifiers require referencing data of another system to determine a particular selected radio 840. For example, referenced radio identifiers may include an eye tracking referenced radio identifier (e.g., "eye", "look", or the like), a touchscreen referenced radio identifier (e.g., "touch", or the like), a flight plan referenced radio identifier (e.g., "waypoint", "next waypoint", or the like), or the like. In some embodiments, utilizing a referenced radio identifier to determine a desired radio 840 includes referencing more than one other system (e.g., the eye tracking system 116 and the FMS 830; a touchscreen display and the FMS 830). For example, if the radio tuning system 118 determines that a radio identifier is an eye tracking referenced radio identifier, the radio tuning system 118 communicates (e.g., sends and/or receives data) with the eye tracking system 116 to receive gaze location data from the eye tracking system 116 to determine a radio associated with graphics (e.g., of the radio tuning GUI 803) currently being looked at by a user associated with a particular radio. For example, if the radio tuning system 118 determines that a radio identifier is an eye tracking referenced radio identifier (e.g., "look" or "eye"), the radio tuning system 118 may request that the eye tracking system send gaze location data to the radio tuning system 118 indicating which (if any) displayed radio graphics (e.g., graphics associated with COM1 or another radio 840) of a radio tuning GUI 803 that the user is currently looking at or has most recently looked at, and the radio tuning system 118 determines that a particular radio 840 (e.g., COM1 or another radio 840) currently corresponds to the eye tracking referenced radio identifier. Further, for example, if the radio tuning system 118 determines that a radio identifier is an eye tracking referenced radio identifier (e.g., "look" or "eye"), the radio tuning system 118 may request that the eye tracking system send gaze location data to the radio tuning system 118 indicating a location (e.g., a waypoint) displayed on a flight plan map GUI associated with the FMS 830 that the user is currently looking at or has most recently looked at, and the radio tuning system 118 determines a particular radio based on the location (e.g., a waypoint) associated with the gaze location data by referencing the eye tracking system 116 and the FMS 830. Additionally, for example, if the radio tuning system 118 determines that a radio identifier is a flight plan referenced radio identifier (e.g., "waypoint", "[waypoint identifier]", "next waypoint", or the like), the radio tuning system 118 may request that the FMS 830 send flight plan location data to the radio tuning system 118 indicating a corresponding flight plan location (e.g., a particular waypoint, such as a current waypoint, identified waypoint, or sequenced waypoint, or the like), and the radio tuning system 118 determines that a particular radio corresponds to the particular flight plan location. Further, for example, if the radio tuning system 118 determines that a radio identifier is a touchscreen referenced radio identifier (e.g., "touch"), the radio tuning system 118 may request that a touchscreen display send touch location data to the radio tuning system 118 indicating which (if any) displayed radio graphics (e.g., graphics associated with COM1 or another radio) of a radio tuning GUI 803 that the user is currently touching or has most recently touched, and the radio tuning system 118 determines that a particular radio (e.g., COM1 or another radio) corresponds to the touchscreen referenced radio identifier. Additionally, for example, if the radio tuning system 118 determines that a radio identifier is a touchscreen referenced radio identifier (e.g., "touch"), the radio tuning system 118 may request that a touchscreen display send touch location data to the radio tuning system 118 indicating a location (e.g., a waypoint) displayed on a flight plan map GUI associated with the FMS 830 that the user is currently touching or has most recently touched, and the radio tuning system 118 determines a particular radio based on the location (e.g., a waypoint) associated with the touch location data by referencing the touchscreen display (e.g., display 801 implemented as a touchscreen display) and the FMS 830.

In some embodiments, the frequency identifier is a static frequency identifier or a referenced frequency identifier. A static frequency identifier may include a numerical frequency or a static location frequency identifier, such as a navigational aid identifier (NAVAID ID, for example as used in Tune-by-Identifier (Tune-by-Ident)) associated with a particular radio frequency. The static location frequency identifier of the text data may make correspond to a specific location. Static frequency identifiers are statically specified frequency identifiers recognizable by the radio tuning system 118 from the text data. In some embodiments, the static frequency identifier refers to a particular frequency that may be looked up in a data structure stored in a non-transitory computer-readable medium that contains static frequency identifiers and associated frequencies. For example, a static frequency identifier may be a multi-character NAVAID ID associated with a particular frequency.

On the other hand, referenced frequency identifiers require referencing data of another system to determine a particular selected frequency. For example, referenced frequency identifiers may include an eye tracking referenced frequency identifier (e.g., "eye", "look", or the like), a touchscreen referenced frequency identifier (e.g., "touch", or the like), a flight plan referenced frequency identifier (e.g., "waypoint", "next waypoint", or the like), or the like. In some embodiments, utilizing a referenced frequency identifier to determine a desired frequency includes referencing more than one other system (e.g., the eye tracking system 116 and the FMS 830; a touchscreen display and the FMS 830; or the like). In some embodiments, the radio identifier and the frequency identifier are combined in a single referenced radio/frequency identifier, such as "WAYPOINT" of a voice command of "TUNE WAYPOINT", and the radio tuning system 118 determines the selected radio and selected frequency based on the combined referenced radio/frequency identifier. For example, if the radio tuning system 118 determines that a frequency identifier is an eye tracking referenced frequency identifier (e.g., "look" or "eye"), the radio tuning system 118 may request that the eye tracking system 116 send gaze location data to the radio tuning system 118 indicating a location (e.g., a waypoint) displayed on a flight plan map GUI associated with the FMS 830 that the user is currently looking at or has most recently looked at, and the radio tuning system 118 determines a particular frequency based on the location (e.g., a waypoint) associated with the gaze location data by referencing the eye tracking system 116 and the FMS 830. Additionally, for example, if the radio tuning system 118 determines that a frequency identifier is a flight plan referenced frequency identifier (e.g., "waypoint", "[waypoint identifier]", "next waypoint", or the like), the radio tuning system 118 may request that the FMS 830 send flight plan location data to the radio tuning system 118 indicating a corresponding flight plan location (e.g., a particular waypoint, such as a current waypoint, identified waypoint, or sequenced waypoint, or the like), and the radio tuning system 118 determines that a particular frequency corresponds to the particular flight plan location. Additionally, for example, if the radio tuning system 118 determines that a frequency identifier is a touchscreen referenced frequency identifier (e.g., "touch"), the radio tuning system 118 may request that a touchscreen display send touch location data to the radio tuning system 118 indicating a location (e.g., a waypoint) displayed on a flight plan map GUI associated with the FMS 830 that the user is currently touching or has most recently touched, and the radio tuning system 118 determines a particular frequency based on the location (e.g., a waypoint) associated with the touch location data by referencing the touchscreen display (e.g., display 801 implemented as a touchscreen display) and the FMS 830.

Referring now to FIG. 8D, a view of a radio tuning GUI 803 associated with a radio tuning system application (RTSA) of one embodiment is shown.

Figure 9:
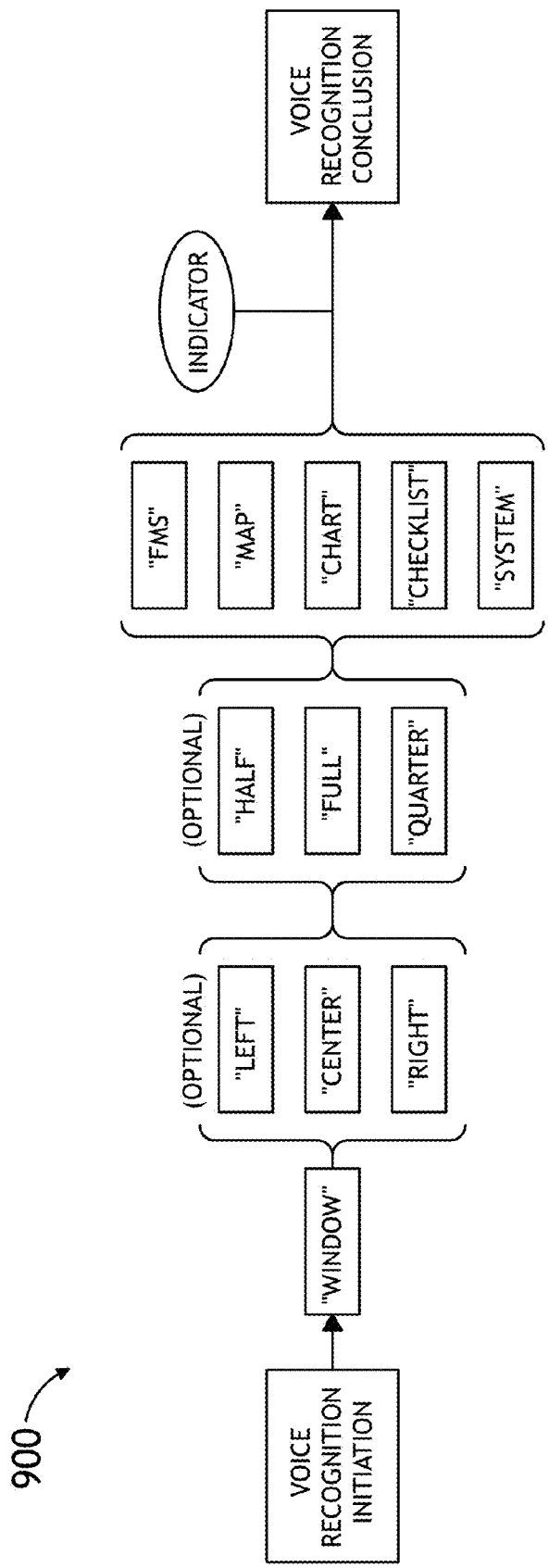
FIG. 9 depicts a flow diagram of a voice recognition sequence for selecting a display format of one embodiment.

Referring now to FIG. 9, an exemplary flow diagram of an exemplary voice recognition sequence 900 for selecting a display format (e.g., a window format (such as a size or location of a window, content (e.g., flight management system (FMS) content, map content, radio tuning system content, chart content, flight checklist content, system content, or the like) to be displayed in a window, or the like)) of a GUI of one or more selected aircraft displays. The voice recognition sequence 900 for selecting a display format may reduce the pilot's time spent performing head-down tasks as would typically be required by interfacing with a keypad. Additionally, in some embodiments, the voice recognition sequence 900 is configured to be received and handled by a processor executing existing display window manager software of an integrated display system, which is configured to receive quick access key inputs of the keypad for selecting a display format. Some embodiments may include configuring the processor, which executes the display window manager software, of the integrated display system to receive and handle the voice recognition sequence 900 for selecting a display format. Further, in some embodiments, selecting a display format may include a pilot using a combination of a voice recognition sequence 900 and physical inputs (e.g., quick access keys).

As shown in FIG. 9, the exemplary voice recognition sequence 900 may include receiving a command to initiate a voice recognition sequence 900. The command to initiate a voice recognition sequence 900 may include detecting a user input to initiate the voice recognition sequence 900, such as by recognizing a spoken initiation keyword (such as "window"), recognizing an eye tracking command, detecting a button or touchscreen press, or the like.

Once the voice recognition sequence 900 has been initiated, the voice recognition sequence 900 may include recognizing a display format keyword (such as "window"), which indicates that the voice recognition sequence is for selecting a display format.

In some embodiments, the voice recognition sequence 900 includes recognizing a display target keyword (such as, if there are three displays, "left", "center", or "right"), which indicates the particular display to target for the display format selection. Further, in some embodiments, the voice recognition sequence 900 may include recognizing a non-spoken display target command (e.g., recognizing, via an eye tracking system 116, the particular display to target for the display format selection based on where a pilot is looking (e.g., a pilot's gaze); recognizing, via a physical input device, the particular display to target for the display format selection based on recognition of a physical input from a user that indicates the display to target for the display format selection; or the like), which indicates the particular display to target for the display format selection. In such embodiments where the voice recognition sequence 900 includes recognizing, via an eye tracking system 116, the particular display to target for the display format selection based on where a pilot is looking (e.g., a pilot's gaze), the voice recognition sequence 900 may include recognizing an eye tracking initiation keyword (such as "eye" or the like) configured to initiate eye tracking, by the eye tracking system 116, to detect the particular target display being viewed by the pilot. Further, in some embodiments, where the eye tracking system contributes to selecting a display target, a computing device is configured to output (e.g., overlay on the GUI of a display) on the display a current location detected by the eye tracking system 116 of a pilot's gaze so that the pilot may compensate for any offset between the eye tracking system's 116 detected gaze location and the pilot's actual focus point and/or so that the pilot may confirm the eye tracking system's 116 detected gaze location.

In some embodiments, the voice recognition sequence 900 includes recognizing a size keyword (such as "half", "full", "quarter", or the like), which indicates the size to make a particular window on a targeted display. In some embodiments, the voice recognition sequence 900 includes recognizing a content keyword (such as "FMS", "map", "chart", "checklist", "system", or the like), which indicates the content to display on the targeted window and/or targeted display. In some embodiments, the voice recognition sequence 900 may include recognizing one or more keywords (e.g., a display target keyword, size keyword, content keyword, or the like) in any order.

In some embodiments, the voice recognition system 115 or a computing device determines whether a valid voice recognition sequence 900 for selecting a display format has been received. If the voice recognition system 115 or a computing device determines that a valid voice recognition sequence 900 for selecting a display format has been received, the voice recognition system 115 or a computing device may output a signal which causes an indicator to indicate (e.g., audibly, such as by a beep, or the like), visually such as by illuminating a light emitting diode as a particular color, presenting a valid symbol on a text buffer (e.g., 601, 701, or 802) or display, or the like) to a user that a valid voice recognition sequence for selecting a display format has been received. If the voice recognition system 115 or a computing device determines that an invalid voice recognition sequence 900 has been received, the voice recognition system 115 or a computing device may output a signal which causes an indicator to indicate (e.g., audibly, such as by a particular beep, or the like, visually such as by illuminating a light emitting diode as a particular color, presenting an invalid symbol on a text buffer (e.g., 601, 701, or 802) or display, presenting an invalid or error message, or the like) to a user that an invalid voice recognition sequence has been received. For example, a nonsensical command (such as "window full system") may be ignored and result in outputting an error message on the text buffer (e.g., 601, 701, or 802).

Additionally, in some embodiments, the voice recognition sequence 900 may include receiving a command to conclude the voice recognition sequence 900. The command to conclude the voice recognition sequence 900 may include detecting a user input to conclude the voice recognition sequence 900, such as by recognizing a spoken conclusion keyword (e.g., "enter"), recognizing an eye tracking command, detecting a button or touchscreen press, or the like.

In response to receiving a valid voice recognition sequence for selecting a display format, the voice recognition system 115, a computing device, a processor executing instructions of display window manager software, or the like performs one or more operations to output GUI data, which corresponds to the display format as selected by the user, to the displays. As such, a user may select a display format by performing a simple voice command which is recognized by the voice recognition system 115.

Exemplary voice recognition sequences 900 for selecting a display format may include "window FMS", "window left chart", "window map half center", or the like. In some embodiments, a voice recognition sequence 900 of "window FMS" may cause a default sized FMS window to be placed in an onside default target location. In some embodiments, a voice recognition sequence 900 of "window left chart" may cause a default sized chart to be placed on a left display. In some embodiments, a voice recognition sequence 900 of "window map half center" may cause a half sized map to be placed on a center display.

Figure 10A:
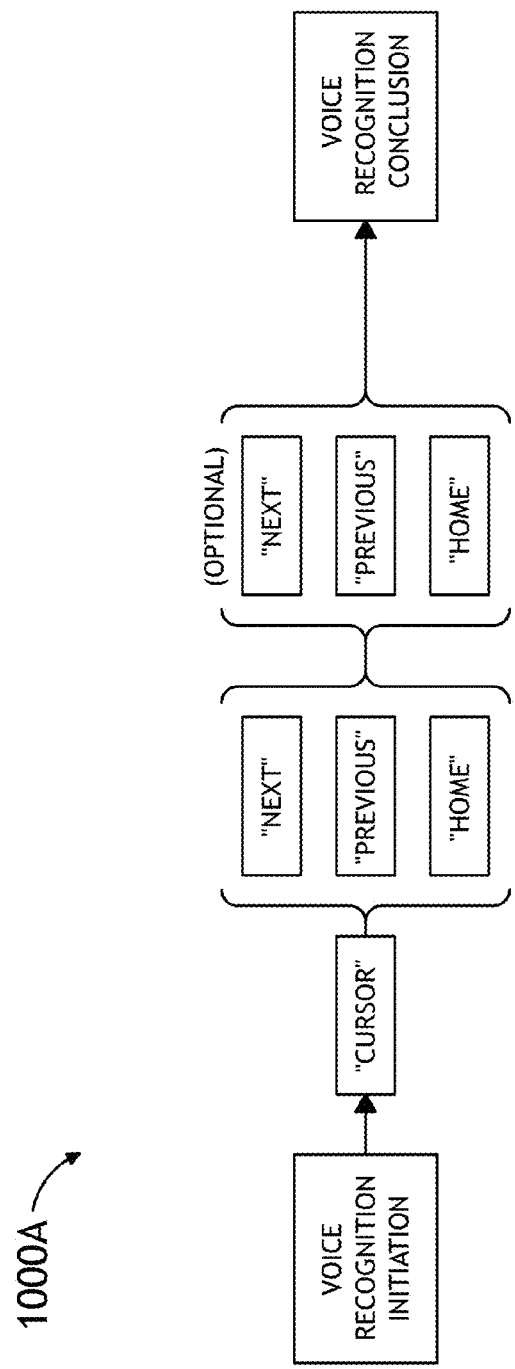
FIG. 10A depicts a flow diagram of a voice recognition sequence for performing cursor control operations of one embodiment.

Referring now to FIG. 10A, an exemplary flow diagram of an exemplary voice recognition sequence 1000A for performing a cursor control operation (such as manipulating a cursor, tabbing, selecting selectable objects (e.g., icons, fields, tabs, or the like) or the like) on a GUI of one or more selected aircraft displays. The voice recognition sequence 1000A for performing a cursor control operation may reduce the pilot's time spent performing head-down tasks as would typically be required by interfacing with a cursor control device. Additionally, in some embodiments, the voice recognition sequence 1000A is configured to be received and handled by existing software of an integrated display system, which is currently configured to receive inputs of a cursor control device for performing cursor control operations. Some embodiments may include configuring the software of the integrated display system to receive and handle the voice recognition sequence 1000A for performing the cursor control operation. Further, in some embodiments, performing the cursor control operation may include a pilot using a combination of a voice recognition sequence 1000A and physical inputs.

As shown in FIG. 10A, an exemplary voice recognition sequence 1000A may include receiving a command to initiate a voice recognition sequence 1000A. The command to initiate a voice recognition sequence 1000A may include detecting a user input to initiate the voice recognition sequence 1000A, such as by recognizing a spoken initiation keyword (such as "cursor"), recognizing an eye tracking command, detecting a button or touchscreen press, or the like.

Once the voice recognition sequence 1000A has been initiated, the voice recognition sequence 1000A may include recognizing a cursor control keyword (such as "cursor", "tab", or the like), which indicates that the voice recognition sequence is for performing a cursor control operation on the location of the cursor.

In some embodiments, the voice recognition sequence 1000A includes recognizing a move keyword (such as "next", "previous", or "home"), which indicates where to move the cursor (e.g., to a next selectable object (e.g., a tab, icon, field, or the like), a previous selectable object (e.g., a tab, icon, field, or the like), to a default home selectable object (e.g., a tab, icon, field, or the like), or the like). In some embodiments, the voice recognition sequence 1000A includes recognizing one or more subsequent move keywords (such as, "next", "previous", or "home"), which indicates where to additionally move the cursor (e.g., to move the cursor to a subsequent next selectable object, which is two or more selectable objects from the original location of the cursor; to move the cursor to a subsequent previous selectable object, which is two or more selectable objects from the original location of the cursor; to a default home selectable object; or the like).

Further, in some embodiments, the voice recognition sequence 1000A may include recognizing a move command (e.g. recognizing, via an eye tracking system 116, a cursor destination or selectable object based on where the pilot is looking (e.g., a pilot's gaze)), which indicates where to move the cursor (e.g., a cursor destination or selectable object (e.g., a tab, icon, field, or the like) identified by a user's gaze, or the like). In such embodiments where the voice recognition sequence 1000A includes recognizing, via an eye tracking system 116, a cursor destination or selectable object based on where the pilot is looking (e.g., a pilot's gaze), the voice recognition sequence 900 may include recognizing an eye tracking initiation keyword (such as "eye" or the like) configured to initiate eye tracking, by the eye tracking system 116, to detect the cursor destination or selectable object based on where the pilot is looking. Additionally, if after recognizing a cursor control keyword (such as "cursor", "tab", or the like), the voice recognition system 115 does not recognize a move keyword within a predetermined amount of time, the voice recognition sequence 1000A may include automatically initiating eye tracking, by the eye tracking system 116, to detect the cursor destination or selectable object based on where the pilot is looking. Further, in some embodiments, where the eye tracking system contributes to moving a cursor, a computing device is configured to output (e.g., overlay on the GUI of a display) on the display a current location detected by the eye tracking system 116 of a pilot's gaze so that the pilot may compensate for any offset between the eye tracking system's 116 detected gaze location and the pilot's actual focus point and/or so that the pilot may confirm the eye tracking system's 116 detected gaze location.

Additionally, in some embodiments, the voice recognition sequence 1000A may include receiving a command to conclude the voice recognition sequence 1000A. The command to conclude the voice recognition sequence 1000A may include detecting a user input to conclude the voice recognition sequence 1000A, such as by recognizing a spoken conclusion keyword (such as "enter", "end", or the like), recognizing an eye tracking command, detecting a button or touchscreen press, or the like.

In response to receiving a voice recognition sequence 1000A for performing a cursor control operation, the voice recognition system 115, a computing device, a processor of an integrated display system, or the like performs one or more operations to output GUI data, which corresponds to the cursor being positioned as a result of performance of the cursor control operation, to one or more displays. As such, a user may manipulate the position of a cursor or navigate selectable objects by performing a simple voice command which is recognized by the voice recognition system 115.

Exemplary voice recognition sequences 1000A for performing cursor control operations may include "cursor home", "cursor next next next", "cursor previous", or the like. In some embodiments, a voice recognition sequence 1000A of "cursor home" may cause a cursor to be placed at a default position. In some embodiments, a voice recognition sequence 1000A of "cursor next next next" may cause a cursor to be moved forward, in a predetermined selectable object (e.g., tab, icon, field, or the like) order, three selectable objects (e.g., tabs, icons, fields, or the like) from an original cursor position. In some embodiments, a voice recognition sequence 1000A of "cursor previous" may cause a cursor to be moved backward, in a predetermined selectable object (e.g., tab) order, one selectable object (e.g., tabs, icons, fields, or the like) from an original cursor position.

Additionally, in some embodiments, the voice recognition sequence 1000A may include recognizing, by the voice recognition sequence 115, an identify keyword to trigger at least one display to display an associated identifier (e.g., a speech identifier) for each selectable object displayed on the at least one display. Further, in some embodiments, recognition of the identify keyword may trigger some (e.g., a set of associated selectable objects) or all of the possible selectable objects of at least one display to be highlighted for easier viewing. Particular exemplary embodiments are configured to provide a meaningful speech name (e.g. a word associated with a particular selectable object, such as "COM") for each selectable object, text entry box, or the like. Other exemplary embodiments are configured to provide speech identifiers for each selectable object, text entry box, or the like that may be spoken as characters of the pilot phonetic alphabet, normal alphabet, numerals, or the like. For example, particular speech identifiers may include "Cursor COM1", "Cursor Identify Alpha", "Cursor Identify One", "Cursor Alpha Alpha", or the like.

Referring now to FIG. 10B, an exemplary flow diagram of an exemplary voice recognition sequence 1000B for performing a raw cursor control operation (such as manipulating a directional movement of a cursor, or the like) on a GUI of one or more selected aircraft displays. The voice recognition sequence 1000B for performing a cursor control operation may reduce the pilot's time spent performing head-down tasks as would typically be required by interfacing with a cursor control device. Additionally, in some embodiments, the voice recognition sequence 1000B is configured to be received and handled by existing software of an integrated display system, which is currently configured to receive inputs of a cursor control device for performing raw cursor control operations. Some embodiments may include configuring a processor of the integrated display system to receive and handle the voice recognition sequence 1000B for performing the raw cursor control operation. Further, in some embodiments, performing the raw cursor control operation may include a pilot using a combination of a voice recognition sequence 1000B and physical inputs. Additionally, in some embodiments, performance of the raw cursor control may be used as a backup cursor control device rather than having a second physical cursor control device.

As shown in FIG. 10B, an exemplary voice recognition sequence 1000B may include receiving a command to initiate a voice recognition sequence 1000B. The command to initiate a voice recognition sequence 1000B may include detecting a user input to initiate the voice recognition sequence 1000B, such as by recognizing a spoken initiation keyword (such as "cursor"), recognizing an eye tracking command, detecting a button or touchscreen press, or the like.

Once the voice recognition sequence 1000B has been initiated, the voice recognition sequence 1000B may include recognizing a cursor control keyword (such as "cursor", or the like), which indicates that the voice recognition sequence is for performing a cursor control operation on the location of the cursor. In some embodiments, the voice recognition sequence 1000B includes recognizing a move keyword (such as, "home", "right", "left", "up", "down", or the like), which indicates to move the cursor in a specified direction by a predetermined increment or to move the cursor to a default position. In some embodiments, the voice recognition sequence 1000B includes recognizing one or more subsequent move keywords (such as "right", "left", "up", "down", or the like), which indicates to further move the cursor in a specified direction by a predetermined increment.

Additionally, in some embodiments, the voice recognition sequence 1000B may include receiving a command to conclude the voice recognition sequence 1000B. The command to conclude the voice recognition sequence 1000B may include detecting a user input to conclude the voice recognition sequence 1000B, such as by recognizing a spoken conclusion keyword (such as "enter", "end", or the like), recognizing an eye tracking command, detecting a button or touchscreen press, or the like.

In response to receiving a voice recognition sequence 1000B for performing a raw cursor control operation, the voice recognition system 115, a computing device, a processor of an integrated display system, or the like performs one or more operations to output GUI data, which corresponds to the cursor having been moved as a result of performance of the raw cursor control operation, to one or more displays. As such, a user may manipulate the position of a cursor by performing a simple voice command which is recognized by the voice recognition system 115.

Exemplary voice recognition sequences 1000B for performing raw cursor control operations may include "cursor home", "cursor left", "cursor right right", or the like. In some embodiments, a voice recognition sequence 1000B of "cursor home" may cause a cursor to be placed at a default position. In some embodiments, a voice recognition sequence 1000B of "cursor left" may cause a cursor to be moved to the left by one predetermined increment from the original cursor position. In some embodiments, a voice recognition sequence 1000B of "cursor right right" may cause a cursor to be moved to the right by two predetermined increments from the original cursor position.

Figure 11:
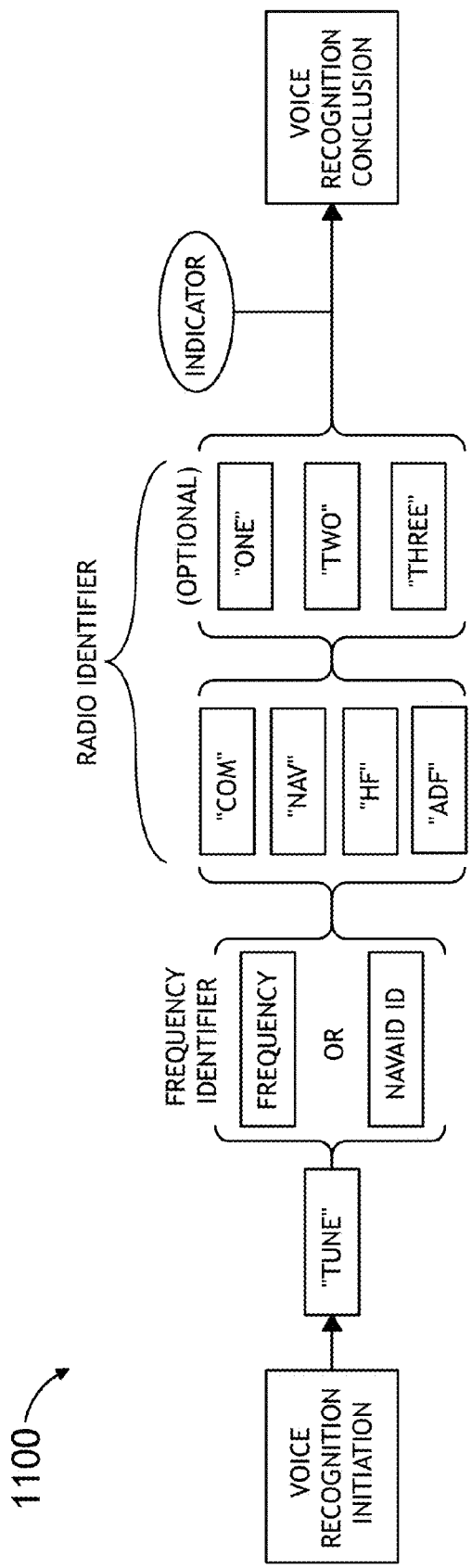
FIG. 11 depicts a flow diagram of a voice recognition sequence for performing one or more radio tuning operations to tune a selected radio to a selected radio frequency of one embodiment.

Referring now to FIG. 11, a flow diagram of a voice recognition sequence 1100 for performing one or more radio tuning operations to tune a selected radio to a selected radio frequency of one embodiment is shown. The voice recognition sequence 1100 for performing one or more radio tuning operations may reduce the pilot's time spent performing head-down tasks as would typically be required by interfacing with a keypad, radio tuning knobs, or the like. Some embodiments may include configuring the processor (e.g., processor 822), which executes a radio tuning system application, of the radio tuning system 118 to receive and handle the voice recognition sequence 1100 for performing one or more radio tuning operations to tune a selected radio to a selected radio frequency. Further, in some embodiments, a user's (e.g., a pilot's) selection of a desired radio and a desired radio frequency may include a using a combination of a voice recognition sequence 1100 and one or more other user inputs (e.g., quick access key user inputs, keyboard inputs, eye tracking system inputs, touchscreen inputs, or the like).

As shown in FIG. 11, the exemplary voice recognition sequence 1100 may include receiving a command to initiate a voice recognition sequence 1100. For example, the command to initiate a voice recognition sequence 1100 may include detecting a user input (e.g., detected user speech) to initiate the voice recognition sequence 1100, such as by recognizing a spoken initiation keyword (such as "tune"), recognizing an eye tracking command (such as "look" or "eye"), detecting a button or touchscreen press, or the like.

In one embodiment, once the voice recognition sequence 1100 has been initiated, the voice recognition sequence 1100 may include recognizing a tune command keyword (such as "tune"), which indicates that the voice recognition sequence is for performing one or more radio tuning operations to tune a selected radio to a selected radio frequency. In some embodiments, the tune command keyword (such as "tune") is also the user input to initiate the voice recognition sequence 1100.

In one embodiment, the voice recognition sequence 1100 includes recognizing a frequency identifier (such as a numerical frequency or a NAVAID ID associated with a particular frequency), which indicates the selected frequency to which a radio is to be tuned. As shown in FIG. 11, the frequency identifier may be a static frequency identifier that is recognizable by the radio tuning system 118 from the voice or text data as being indicative of a particular frequency. For example, the static frequency identifier may be a numerical frequency (such as "121.6" indicative of a frequency of 121.6 MHz) or a location identifier (such as a NAVAID ID (e.g., "CID" or "Charlie India Delta") indicative of frequency associated with a particular location (e.g., Cedar Rapids Airport)). In some embodiments, the numerical frequency does not need any trailing zeroes or leading ones. The frequency associated with the numerical frequency identified may be contextually determined based on the radio identifier; for example, a numerical frequency identified may be determined to be in megahertz (MHz) if the voice recognition sequence 1100 includes a COM radio identifier or may be determined to be in kilohertz (kHz) if the voice recognition sequence 1100 includes an ADF radio identifier. In some embodiments, the voice recognition sequence 1100 includes recognizing a referenced frequency identifier for the radio tuning system 118 to reference data of one or more other systems (e.g., an eye tracking system 116, a flight management system (FMS) 830, a touchscreen display, or the like) to determine a particular selected frequency, as explained in more detail above.

In one embodiment, the voice recognition sequence 1100 includes recognizing a radio identifier, which indicates the selected radio to tune. As shown in FIG. 11, the radio identifier may be a static frequency identifier that is recognizable by the radio tuning system 118 from the voice or text data as being indicative of a particular radio 840. For example, the static radio identifier may be a multi-character static radio identifier (such as, "COM1", "COM2", "NAV1", "NAV2", "HF", "ADF", or the like) associated with a particular radio (e.g., communication radio 1 (COM1) for a pilot, communication radio 2 (COM2) for a copilot, navigation radio 1 (NAV1) for a pilot, navigation radio 2 (NAV2) for a copilot, high frequency (HF) radio, automatic direction finder (ADF) radio, respectively, or the like) of the radio(s) 840. In some embodiments, the static radio identifier optionally includes a number (e.g., a number suffix or prefix) identifying a particular radio (e.g., COM1, COM2, NAV1, NAV2, or the like) where there might be two or more radios of the same type (e.g., COM, NAV). Likewise, the static radio identifier may optionally omit the number. For example, if the number of the static radio identifier is omitted, the radio tuning system 118 may determine that the selected radio is an onside radio associated with the pilot or copilot providing the voice recognition sequence 1100; for example, if the copilot provides a voice recognition sequence 1100 including a radio identifier of "COM", the radio tuning system 118 determines that COM2 is the selected radio. Additionally, a number for a static radio identifier is not required if there is only one radio of a particular type (e.g., if there is only one ADF radio, COM radio, or the like). In some embodiments, the voice recognition sequence 1100 includes recognizing a referenced radio identifier for the radio tuning system 118 to reference data of one or more other systems (e.g., an eye tracking system 116, a flight management system (FMS) 830, a touchscreen display, or the like) to determine a particular selected radio, as explained in more detail above.

In some embodiments, the voice recognition sequence 1100 may include receiving a single referenced radio/frequency identifier, such as "WAYPOINT" of a voice recognition sequence of "TUNE WAYPOINT", and the radio tuning system 118 determines the selected radio and selected frequency based on the combined referenced radio/frequency identifier.

In some embodiments, the voice recognition system 115, radio tuning system 118, or another computing device determines whether a valid voice recognition sequence 1100 for performing one or more radio tuning operations to tune a selected radio to a selected radio frequency has been received. If the voice recognition system 115, radio tuning system 118, or another computing device determines that a valid voice recognition sequence 1100 for performing one or more radio tuning operations to tune a selected radio to a selected radio frequency has been received, the voice recognition system 115, radio tuning system 118, or another computing device may output a signal which causes an indicator to indicate (e.g., audibly, such as by a beep, or the like), visually such as by illuminating a light emitting diode as a particular color, presenting a valid symbol on a text buffer (e.g., 601, 701, or 802) or display, or the like) to a user that a valid voice recognition sequence 1100 for performing one or more radio tuning operations to tune a selected radio to a selected radio frequency has been received. If the voice recognition system 115, radio tuning system 118, or another computing device determines that an invalid voice recognition sequence 1100 has been received, the voice recognition system 115, radio tuning system 118, or another computing device may output a signal which causes an indicator to indicate (e.g., audibly, such as by a particular beep, or the like, visually such as by illuminating a light emitting diode as a particular color, presenting an invalid symbol on a text buffer (e.g., 601, 701, or 802) or display, presenting an invalid or error message, or the like) to a user that an invalid voice recognition sequence 1100 has been received. For example, a nonsensical command may be ignored and result in outputting an error message on the text buffer (e.g., 601, 701, or 802).

Additionally, in some embodiments, the voice recognition sequence 1100 may optionally include receiving a command to conclude the voice recognition sequence 1100. The command to conclude the voice recognition sequence 1100 may include detecting a user input to conclude the voice recognition sequence 1100, such as by recognizing a spoken conclusion keyword (e.g., "enter"), recognizing an eye tracking command, detecting a button or touchscreen press, or the like. In some embodiments, the voice recognition sequence 1100 is displayed to a user, for example, on a text buffer (e.g., 601, 701, or 802) or other display, and the command to conclude the voice recognition sequence 1100 includes a command (e.g., a voice command, button depression, or other user input) to accept or reject the voice recognition sequence 1100 prior to executing the voice recognition sequence 1100 for performing one or more radio tuning operations to tune a selected radio to a selected radio frequency. In some embodiments, once a valid voice recognition sequence 1100 is received, the voice recognition sequence 1100 is automatically concluded.

In response to receiving a valid voice recognition sequence 1100 for performing one or more radio tuning operations to tune a selected radio to a selected radio frequency, the radio tuning system 118, a computing device, a processor (e.g., 822) executing a radio tuning system application, or the like performs one or more operations to tune a selected radio to a selected radio frequency.

Exemplary voice recognition sequences 1100 for performing one or more radio tuning operations to tune a selected radio to a selected radio frequency may include, but are not limited to, the following: "TUNE ONE TWO ONE SIX COM" (i.e., a command to tune the onside COM radio to 121.6 MHz, which is a ground control frequency); "TUNE ONE ONE FOUR POINT ONE NAV TWO" (i.e., a command to tune NAV2 to 114.1 MHz, which is a very high frequency omnidirectional range (VOR) frequency); "TUNE CHARLIE INDIA DELTA NAV" (i.e., a command to tune the onside NAV to the Cedar Rapids Airport (CID) VOR frequency); "TUNE TWO ONE NINE ADF" (i.e., a command to tune the onside ADF radio to 219 kHz); "TUNE LOOK WAYPOINT" (e.g., a command to tune an associated onside radio to a frequency associated with a displayed waypoint that the user is looking at); "TUNE TOUCH WAYPOINT" (e.g., a command to tune an associated onside radio to a frequency associated with a displayed waypoint that the user is touching on touchscreen display); "TUNE NEXT WAYPOINT" (e.g., a command to tune an associated onside radio to a frequency associated with a next sequenced waypoint of a flight plan); "TUNE LOOK ONE TWO THREE" (e.g., a command to tune a radio that the user is looking at on a radio tuning GUI 803 to 123 MHz, kHz, etc., where the frequency units are contextually based on the bandwidth of the looked at radio); "TUNE AUTO NAV" or "TUNE DEFAULT NAV" (e.g., a command to tune the onside NAV radio to a default frequency associated with a particular flight operation (e.g., taxi, takeoff, cruise, landing, etc.) of an aircraft and/or a particular position of the aircraft with respect to a current flight plan); "TUNE AUTO ALL" or "TUNE DEFAULT ALL" (e.g., a command to tune all radios to default frequencies associated with a particular flight operation (e.g., taxi, takeoff, cruise, landing, etc.) of an aircraft and/or a particular position of the aircraft with respect to a current flight plan); or the like.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the disclosed subject matter. The accompanying claims may present elements of the various steps in a sample order, and are not necessarily meant to be limited to the specific order or hierarchy presented.

It is believed that embodiments of the present disclosure and many of its attendant advantages will be understood by the foregoing description, and it will be apparent that various changes can be made in the form, construction, and arrangement of the components thereof without departing from the scope of the disclosure or without sacrificing all of its material advantages. The form herein before described being merely an explanatory embodiment thereof, it is the intention of the following claims to encompass and include such changes.

What is claimed is:

1. A method, comprising:
receiving text data corresponding to user speech recognized by a voice recognition system;
receiving gaze location data from an eye tracking system;
determining at least one desired radio of a plurality of radios and at least one desired radio frequency based at least on the text data and the gaze location data; and
performing one or more radio tuning operations to tune each of the at least one desired radio to a particular desired radio frequency of the at least one desired radio frequency.

2. The method of claim 1, further comprising:
receiving data from at least one other system,
wherein determining the at least one desired radio of the plurality of radios and the at least one desired radio frequency based at least on the text data further comprises:
determining the at least one desired radio of the plurality of radios and the at least one desired radio frequency based at least on the text data and the data received from the at least one other system,
wherein at least one of the voice recognition system, the eye tracking system, and the at least one other system comprises one or more processors.

3. The method of claim 1, wherein the text data includes at least one of an eye tracking referenced radio identifier, an eye tracking referenced frequency identifier, or an eye tracking combined referenced radio/frequency identifier.

4. The method of claim 1, further comprising:
receiving location data from a flight management system,
wherein determining the at least one desired radio of the plurality of radios and the at least one desired radio frequency based at least on the text data further and the gaze location data comprises:
determining the at least one desired radio of the plurality of radios and the at least one desired radio frequency based at least on the text data, the gaze location data, and the location data,
wherein at least one of the voice recognition system, the eye tracking system, and the flight management system comprises one or more processors.

5. The method of claim 4, wherein the location data includes data of a waypoint of a flight plan.

6. The method of claim 1, further comprising:
receiving location data from a flight management system,
wherein determining the at least one desired radio of the plurality of radios and the at least one desired radio frequency based at least on the text data and the gaze location data further comprises:
determining the at least one desired radio of the plurality of radios and the at least one desired radio frequency based at least on the text data, the gaze location data, and the location data.

7. The method of claim 1, wherein receiving the text data corresponding to the user speech recognized by the voice recognition system further comprises:
receiving the text data from a text buffer, the text data corresponding to the user speech recognized by the voice recognition system, the text buffer configured to present the text data to a user for verification.

8. The method of claim 7, wherein at least one of the voice recognition system, the eye tracking system, and the flight management system comprises one or more processors, wherein the text buffer comprises at least one of a portion of a display of an aircraft or a display implemented on a keypad of the aircraft.

9. The method of claim 1, wherein receiving the text data corresponding to the user speech recognized by the voice recognition system further comprises:
receiving the text data directly from the voice recognition system, the text data corresponding to the user speech recognized by the voice recognition system.

10. The method of claim 1, wherein the text data includes at least one of a radio identifier or a frequency identifier.

11. The method of claim 1, wherein the text data includes a radio identifier and a frequency identifier.

12. The method of claim 1, wherein the text data includes at least one of a static radio identifier or a static frequency identifier.

13. The method of claim 1, wherein the text data includes at least one of a referenced radio identifier, a referenced radio frequency identifier, or a combined referenced radio/frequency identifier.

14. The method of claim 1, wherein receiving the text data corresponding to the user speech recognized by the voice recognition system further comprises:
receiving the text data corresponding to the user speech recognized by the voice recognition system of an aircraft.

15. The method of claim 14, wherein at least one of the voice recognition system and the eye tracking system comprises one or more processors, wherein determining the desired radio of the at least one plurality of radios and the at least one desired radio frequency based at least on the text data further comprises:
determining at least two desired radios of the plurality of radios of the aircraft and at least two desired radio frequencies based at least on the text data and the gaze location data.

16. The method of claim 1, wherein at least one of the voice recognition system and the eye tracking system comprises one or more processors.

17. A system, comprising:
a voice recognition system configured to recognize user speech and output text data corresponding to the user speech;
an eye tracking system configured to output gaze location data; and
a radio tuning system configured to:
receive text data corresponding to the user speech recognized by the voice recognition system;
receive gaze location data from the eye tracking system;
determine at least one desired radio of a plurality of radios and at least one desired radio frequency based at least on the text data and the gaze location data; and
perform one or more radio tuning operations to tune each of the at least one desired radio to a particular desired radio frequency of the at least one desired radio frequency,
wherein at least one of the voice recognition system, the eye tracking system, and the radio tuning system comprises one or more processors.

18. A method, comprising:
receiving text data corresponding to user speech recognized by a voice recognition system of an aircraft;
receiving gaze location data from an eye tracking system of the aircraft;

determining one or more aircraft function operations to be performed based at least on the text data and the gaze location data; and performing, by a processor, the one or more aircraft function operations.

19. The method of claim 18, wherein at least one of the voice recognition system and the eye tracking system comprises one or more processors, wherein receiving the text data corresponding to the user speech recognized by the voice recognition system of the aircraft further comprises:

receiving the text data from a text buffer, the text data corresponding to the user speech recognized by the voice recognition system of the aircraft, the text buffer configured to present the text data to a user for verification.

20. The method of claim 18, wherein at least one of the voice recognition system and the eye tracking system comprises one or more processors.

\* \* \* \* \*